(12) United States Patent
Manassen et al.

(10) Patent No.: US 11,592,755 B2
(45) Date of Patent: Feb. 28, 2023

(54) ENHANCING PERFORMANCE OF OVERLAY METROLOGY

(71) Applicant: KLA Corporation, Milpitas, CA (US)

(72) Inventors: Amnon Manassen, Haifa (IL); Andrew Hill, Portland, OR (US); Yonatan Vaknin, Migdal Ha'emek (IL); Yossi Simon, Qiryat Atta (IL); Daria Negri, Haifa (IL); Vladimir Levinski, Migdal Ha'emek (IL); Yuri Paskover, Binyamina (IL); Anna Golotsvan, Qiryat Tivon (IL); Nachshon Rothman, DN Oshrat (IL); Nireekshan K. Reddy, Tel Aviv (IL); Nir BenDavid, Migdal Ha'emek (IL); Avi Abramov, Haifa (IL); Dror Yaacov, Migdal Ha'emek (IL); Yoram Uziel, Migdal Ha'emek (IL); Nadav Gutman, Zichron Ya'aqov (IL)

(73) Assignee: KLA Corporation, Milpitas, CA (US)

(*) Notice: Subject to any disclaimer, the term of this patent is extended or adjusted under 35 U.S.C. 154(b) by 0 days.

(21) Appl. No.: 17/219,869

(22) Filed: Mar. 31, 2021

(65) Prior Publication Data

US 2022/0317577 A1    Oct. 6, 2022

(51) Int. Cl.
*G03F 7/20* (2006.01)
*G02B 27/28* (2006.01)
*H04N 5/225* (2006.01)

(52) U.S. Cl.
CPC ....... *G03F 7/70633* (2013.01); *G02B 27/283* (2013.01); *G03F 7/70641* (2013.01); *H04N 5/2256* (2013.01)

(58) Field of Classification Search
CPC ............ G03F 7/70633; G03F 7/70641; G02B 27/283; H04N 5/2256
See application file for complete search history.

(56) References Cited

U.S. PATENT DOCUMENTS

| | | | |
|---|---|---|---|
| 7,876,440 B2 * | 1/2011 | Mieher | G03F 7/70633 356/401 |
| 10,451,412 B2 * | 10/2019 | Adel | G01N 21/9501 |

(Continued)

FOREIGN PATENT DOCUMENTS

KR    20160014472 A1    2/2016

OTHER PUBLICATIONS

WIPO, ISR for International Application No. PCT/US2021/039472, Dec. 20, 2021.

*Primary Examiner* — Hung V Nguyen
(74) *Attorney, Agent, or Firm* — Hodgson Russ LLP

(57) ABSTRACT

A method for metrology includes directing at least one illumination beam to illuminate a semiconductor wafer on which at least first and second patterned layers have been deposited in succession, including a first target feature in the first patterned layer and a second target feature in the second patterned layer, overlaid on the first target feature. A sequence of images of the first and second target features is captured while varying one or more imaging parameters over the sequence. The images in the sequence are processed in order to identify respective centers of symmetry of the first and second target features in the images and measure variations in the centers of symmetry as a function of the varying image parameters. The measured variations are applied in measuring an overlay error between the first and second patterned layers.

30 Claims, 14 Drawing Sheets

(56) References Cited

U.S. PATENT DOCUMENTS

| | | | |
|---|---|---|---|
| 10,481,506 B2 | 11/2019 | Bozkurt et al. | |
| 10,520,830 B2* | 12/2019 | Kicken | G03F 7/70775 |
| 10,831,109 B2* | 11/2020 | Jak | G03F 7/70683 |
| 10,895,923 B2* | 1/2021 | Ishizaki | G06F 3/0412 |
| 2015/0043803 A1 | 2/2015 | Jeong | |
| 2015/0204664 A1 | 7/2015 | Bringoltz et al. | |
| 2019/0198403 A1 | 6/2019 | Fang et al. | |

\* cited by examiner

ENHANCING PERFORMANCE OF OVERLAY METROLOGY

FIELD OF THE INVENTION

The present invention relates generally to manufacture of semiconductor devices, and particularly to apparatus and methods for semiconductor circuit metrology.

BACKGROUND

Semiconductor circuits are commonly manufactured using photolithographic methods. In photolithography, a thin layer of a photosensitive polymer (photoresist) is deposited over a semiconductor wafer and patterned using optical or other radiation, leaving parts of the wafer covered by the photoresist. After patterning, the wafer is modified by methods such as etching and ion bombardment to change the material properties or the topography of the wafer, while the parts of the wafer covered by the photoresist are not affected.

Semiconductor circuit metrology is commonly used for measuring properties of the patterned photoresist, such as the topography and location of the patterned features. Accurate location of the patterned features of the photoresist with respect to previous process layers is crucial for assuring a high yield of the photolithographic process. Any error in the registration (misregistration) of the patterned photoresist with respect to an underlying process layer is referred to as "overlay error." As an example, in typical semiconductor circuits with minimum linewidths of 10-14 nm (so-called 10-nm design rule), the maximal permissible overlay error is 2-3 nm. In leading-edge semiconductor circuits, the linewidths are shrinking to 5 nm, with a concomitant reduction in maximal permissible overlay error.

Overlay error is commonly measured using optical overlay metrology tools, as optical radiation in the visible and near-infrared wavelengths is capable of penetrating through the photoresist layer, as well as through dielectric layers under the photoresist. Optical overlay metrology tools, such as the Archer™-series tools by KLA Corporation (Milpitas, Calif., USA), image a proxy target (such as AIM™ overlay target by KLA) located in the scribe lines of the semiconductor wafer (the lines separating adjacent semiconductor chips). An image analysis algorithm is applied to the acquired images in order to locate the center of symmetry (CoS) of a set of target features in the process layer and the CoS of corresponding target features in the patterned photoresist layer. The overlay error is computed as the distance between the centers of symmetry of the target features of the two layers.

The terms "optical rays," "optical radiation," "light," and "beams of radiation," as used in the present description and in the claims, refer generally to any and all of visible, infrared, and ultraviolet radiation.

SUMMARY

Embodiments of the present invention that are described hereinbelow provide improved apparatus and methods for semiconductor circuit metrology.

There is therefore provided, in accordance with an embodiment of the invention, a method for metrology, which includes directing at least one illumination beam to illuminate a semiconductor wafer on which at least first and second patterned layers have been deposited in succession, including a first target feature in the first patterned layer and a second target feature in the second patterned layer, overlaid on the first target feature. A sequence of images of the first and second target features is captured while varying one or more imaging parameters over the sequence. The images in the sequence are processed in order to identify respective centers of symmetry of the first and second target features in the images and measure variations in the centers of symmetry as a function of the varying image parameters. The measured variations are applied in measuring an overlay error between the first and second patterned layers.

In a disclosed embodiment, the first patterned layer includes a process layer, and the second patterned layer includes a resist layer deposited over the process layer.

In some embodiments, capturing the sequence of the images includes capturing first and second images of the target features using first and second cameras in mutual registration, and processing the images includes measuring the variations in the centers of symmetry by comparing the first and second images. In one embodiment, capturing the first and second images includes projecting a registration image toward the first and second cameras, and registering the first and second cameras with respect to the registration image. In an example embodiment, projecting the registration image includes generating and projecting a grating pattern onto respective detector arrays in the first and second cameras alongside the images of the target features.

Additionally or alternatively, capturing the first and second images includes setting the one or more of the imaging parameters to a first setting in the first images and to a second setting in the second images. In a disclosed embodiment, setting the one or more of the imaging parameters includes setting the first and second cameras in different, respective first and second focal positions, and stepping the first and second cameras through respective first and second sequences of the first and second focal positions in order to measure a variation of the centers of symmetry as a function of the focal positions. In an example embodiment, the first and second focal positions are separated by a constant focal distance $\Delta Z$, and in each step of the first and second sequences, both the first and second focal positions are incremented by $\Delta Z$.

Further additionally or alternatively, the at least one illumination beam includes first and second illumination beams in different, respective first and second polarization states, and capturing the first and second images includes applying a polarizing beamsplitter to direct light reflected from the wafer in the first polarization state toward the first camera and to direct light reflected from the wafer in the second polarization state toward the second camera.

In one embodiment, capturing the sequence of the images includes capturing the images of the target features at different focal settings, and processing the images includes measuring the variations in the centers of symmetry as a function of the focal settings.

Additionally or alternatively, capturing the sequence of the images includes capturing the images of the target features at multiple different wavelengths, and processing the images includes measuring the variations in the centers of symmetry as a function of the wavelengths.

Further additionally or alternatively, capturing the sequence of the images includes capturing the images of the target features in two or more different polarization states, and processing the images includes measuring the variations in the centers of symmetry as a function of the polarization states.

Still further additionally or alternatively, capturing the sequence of the images includes capturing the images of the target features at multiple different offsets of at least one aperture of the at least one illumination beam, and processing the images includes measuring the variations in the centers of symmetry as a function of the offsets of the aperture.

In another embodiment, capturing the sequence of the images includes capturing the images of the target features using a camera in different angular orientations of the semiconductor wafer relative to the camera, and processing the images includes measuring a tool-induced shift of the centers of symmetry as a function of the angular orientations.

In some embodiments, applying the measured variations includes finding, responsively to the measured variations, an optimal range of the one or more imaging parameters, and generating a recipe for measuring the overlay error by setting the one or more imaging parameters to values within the optimal range. In a disclosed embodiment, capturing the sequence of the images includes capturing the images of multiple target features at multiple different locations on the semiconductor wafer, and finding the optimal range includes applying the variations measured at the multiple different locations in order to choose the range that is optimal over an area of the semiconductor wafer.

Additionally or alternatively, processing the images includes measuring an asymmetry of at least one of the target features.

There is also provided, in accordance with an embodiment of the invention, a method for metrology, which includes directing at least one illumination beam to illuminate a semiconductor wafer on which at least one patterned layer has been deposited, including a grating that includes multiple bars oriented parallel to a predefined axis. One or more images of the grating are captured and processed in order to characterize an asymmetry of one or more of the bars about the axis. The characterized asymmetry is applied in making a metrological evaluation of the patterned layer.

In a disclosed embodiment, capturing the one or more images includes capturing a sequence the images of the grating at different focal settings, and processing the one or more images includes measuring a variation in a center of symmetry of the grating in the images as a function of the focal settings, and characterizing the asymmetry based on the measured variation. Additionally or alternatively, processing the one or more images includes computing a correlation between an image of the one or more of the bars and a reflected version of the image, and deriving a measure of the asymmetry from the computed correlation.

There is additionally provided, in accordance with an embodiment of the invention, an optical inspection apparatus including an illumination assembly, configured to direct at least one illumination beam to illuminate a semiconductor wafer on which at least first and second patterned layers have been deposited in succession, including a first target feature in the first patterned layer and a second target feature in the second patterned layer, overlaid on the first target feature. An imaging assembly is configured to capture a sequence of images of the first and second target features. A controller is configured to vary one or more imaging parameters of the apparatus over the sequence, to process the images in the sequence in order to identify respective centers of symmetry of the first and second target features in the images and measure variations in the centers of symmetry as a function of the varying image parameters, and to apply the measured variations in measuring an overlay error between the first and second patterned layers.

There is further provided, in accordance with an embodiment of the invention, an optical inspection apparatus, including an illumination assembly configured to direct at least one illumination beam to illuminate a semiconductor wafer on which at least one patterned layer has been deposited, including a grating that includes multiple bars oriented parallel to a predefined axis. An imaging assembly is configured to capture one or more images of the grating. A controller is configured to process the one or more images in order to characterize an asymmetry of one or more of the bars about the axis and to apply the characterized asymmetry in making a metrological evaluation of the patterned layer.

The present invention will be more fully understood from the following detailed description of the embodiments thereof, taken together with the drawings in which:

DETAILED DESCRIPTION OF EMBODIMENTS

Overview

Figure 1:
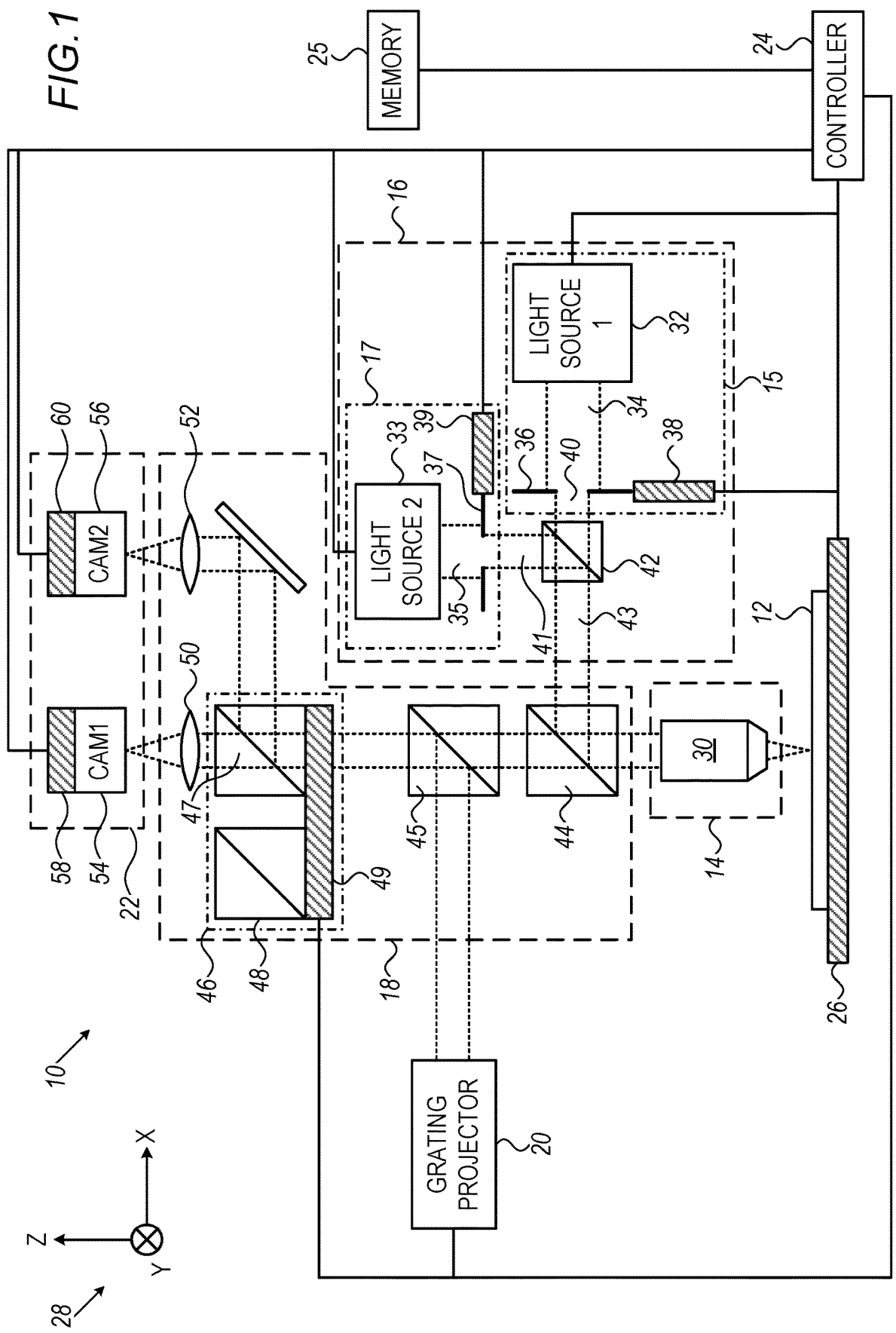
FIG. 1 is a schematic side view of an optical inspection apparatus for measuring optical properties of patterned thin-film layers on a semiconductor wafer, in accordance with an embodiment of the invention.

Proxy targets for overlay metrology are commonly used for precise measurements of the overlay between successive patterned layers on a semiconductor wafer. These layers may comprise, for example, a process layer and a resist layer, or in after-etch applications between two process layers. (Thus, although example embodiments are described below with reference to a process layer and a resist layer, the principles of these embodiments may be applied, mutatis mutandis, to a first process layer and a second process layer.)

However, the features in the proxy targets (both resist and process layer target features) differ from the corresponding features in the device area: The features of the proxy targets typically have broader lines than those in the devices, so as to be resolvable by metrology tools operating in the visible or near-infrared spectrum of light; and the targets are symmetrical in their design, thus enabling the implementation of powerful symmetry-based image processing algorithms for computing the value of the overlay. Moreover, the proxy targets are commonly located in the scribe lines of the semiconductor wafer in order not to take up valuable "real estate" of the device area. The optical distortions of the photolithographic exposure system (scanner) are different in the scribe line from those in the device area, thus leading to a spatially varying differential shift between the patterns in the proxy targets and the corresponding patterns in the devices.

These design and metrology considerations cause the features of the proxy targets to react to lithographic and process effects differently from the device features in the chip area, and the overlay error measured from a proxy target may have an offset with respect to the overlay error in the actual device features. A calibration function can be applied in order to derive an accurate measure of the overlay error in the device area from the overlay error measured from the proxy targets. However, accurate calibration requires stable and repeatable overlay measurements from the proxy targets. These, in turn, are challenged by process-induced effects, such as feature asymmetries.

Furthermore, as each proxy target comprises both target features in the photoresist and target features in a previous process layer, these two sets of target features may be separated by distances of up to several microns in the direction perpendicular to the semiconductor wafer. The two sets of target features are in these cases imaged by focusing the metrology tool separately to the resist layer and to the process layer and acquiring images at the respective focal settings. However, the combination of process variation effects and topography make it difficult to find an optimal metrology "recipe," i.e., a set of metrology conditions (for example, focus, numerical aperture of illumination, and wavelength) that yield stable and repeatable overlay measurements from the proxy targets.

The embodiments of the present invention that are described herein address these problems by providing an optical metrology tool and a method that enable independent characterization of the two sets of target features of an optical overlay proxy target. In some embodiments, the metrology tool comprises two imaging cameras, which are mutually registered but are focused at a fixed height difference on the proxy target. Images captured by the two cameras are compared in order to calibrate and correct for variations in optical characteristics of the proxy target layers such as variations in the center of symmetry (CoS) due to imaging parameters such as focal variations, spectral response, and polarization.

In some embodiments, a projector projects a registration image, such as an image of a two-dimensional grating, toward the two cameras. The focus of the metrology tool is stepped through consecutive steps, each equal to the fixed height difference, so that one camera (referred to as CAM1) always arrives at the focal setting where the other camera (CAM2) was during the previous step. When CAM1 arrives at its new focal position, it is registered with the image acquired by CAM2 when it was at that focal position. At each focal position, each camera acquires an image of the proxy target. The series of acquired images of each of the two sets of target features of the proxy target are registered with each other through the focal settings. From these two series of images, the variation of the CoS with respect to focus can be computed for each of the two sets of target features. The stability of the CoS with respect to focus gives the focal settings at which the images of the two sets of target features should be acquired for a stable overlay measurement. A stable overlay measurement, in turn, enables a stable and repeatable calibration of overlay errors in the semiconductor circuitry.

Additionally or alternatively, the variability of the CoS of each set of target features with respect to the illuminating wavelength and/or polarization is mapped, and this mapping is then used to achieve stable overlay measurements. Thus, the present embodiments identify an optimal measurement range within the two-dimensional space of wavelength and focus.

Description of Optical Inspection Apparatus

FIG. 1 is a schematic pictorial illustration of an optical inspection apparatus 10 for measuring optical properties of patterned thin-film layers on a semiconductor wafer 12, in accordance with an embodiment of the invention.

Optical inspection apparatus 10 comprises an imaging assembly 14, an illumination assembly 16, and an optical relay assembly 18. Optical inspection apparatus further comprises a grating projector 20, a camera assembly 22, a controller 24, a memory 25, and a table 26 on which semiconductor wafer is mounted. The orientation of apparatus 10 and its components is defined within Cartesian coordinates 28. In subsequent figures, the same Cartesian coordinates 28 are shown in an appropriate orientation. Lower-case letters x, y, and z are used hereinbelow to denote the three Cartesian coordinate axes, whereas upper-case letters X, Y, and Z are used to denote coordinates on these axes.

Imaging assembly 14 is schematically shown as a single objective lens 30. Alternatively, assembly 14 may comprise an interferometric objective (for example, a Linnik-interferometer), a dark-field objective, a phase-contrast objective, or another suitable kind of objective lens or combination of lenses and/or mirrors.

Objective lens 30 is typically a compound lens of very high optical quality with a high numerical aperture (NA), for example an NA of 0.7 or even higher. In an alternative embodiment, objective lens 30 may have a variable NA, controlled by controller 24.

In the pictured embodiment, illumination assembly 16, controlled by controller 24, comprises two illuminators 15 and 17, which comprise respectively light sources 32 and 33 emitting optical radiation in respective beams 34 and 35 independently at one or more discrete tunable wavelengths or over one or more continuous spectra in continuous-wave (CW) or pulsed form. Light sources 32 and 33 may also emit optical radiation in various polarization states, such as, for example, unpolarized, linearly polarized, or circularly polarized radiation.

Illuminators 15 and 17 further comprise two respective aperture assemblies 36 and 37, connected to respective light sources 32 and 33. Aperture assemblies 36 and 37 are actuated by respective actuators 38 and 39, bringing different apertures of assembly 36 into beam 34, and different apertures of assembly 37 into beam 35. Actuators 38 and 39 may further make fine adjustments to each individual aperture of each assembly in the plane of the respective aperture. Beams 40 and 41 emitted respectively from illuminators 15 and 17 are combined by a beamsplitter 42 collinearly into a beam 43. This kind of a dual illumination assembly, comprising two illuminators, enhances the flexibility of apparatus 10 for providing independent illumination conditions (for example, wavelength, polarization, and/or NA) to the process layer and the resist layer on wafer 12.

Alternatively, illumination assembly 16 may comprise a single illuminator, for example illuminator 15, wherein the illumination conditions for process and resist layers are selected by a suitable adjustment of light source 32 and aperture assembly 36. Further alternatively, illumination assembly may comprise more than two illuminators, for example three or four illuminators, wherein the beams exiting from the respective illuminators are combined using a suitable optical arrangement, such as beamsplitters.

Optical relay assembly 18 comprises beamsplitters 44 and 45, a beamsplitter assembly 46, and lenses 50 and 52. Beamsplitter assembly 46 comprises beamsplitters 47 and 48, which can be moved into and out of the optical path of apparatus 10 using an actuator 49, as will be further detailed below. Camera assembly 22 comprises two detector arrays 54 and 56, which are also referred to as "cameras" and are respectively denoted as CAM1 and CAM2. Camera assembly 22 further comprises two actuators 58 and 60, which move CAM1 and CAM2, respectively, along the z-axis. Although lenses 50 and 52 are shown in the figure as single lenses, they may alternatively comprise multiple lenses and/or mirrors.

Figure 2:
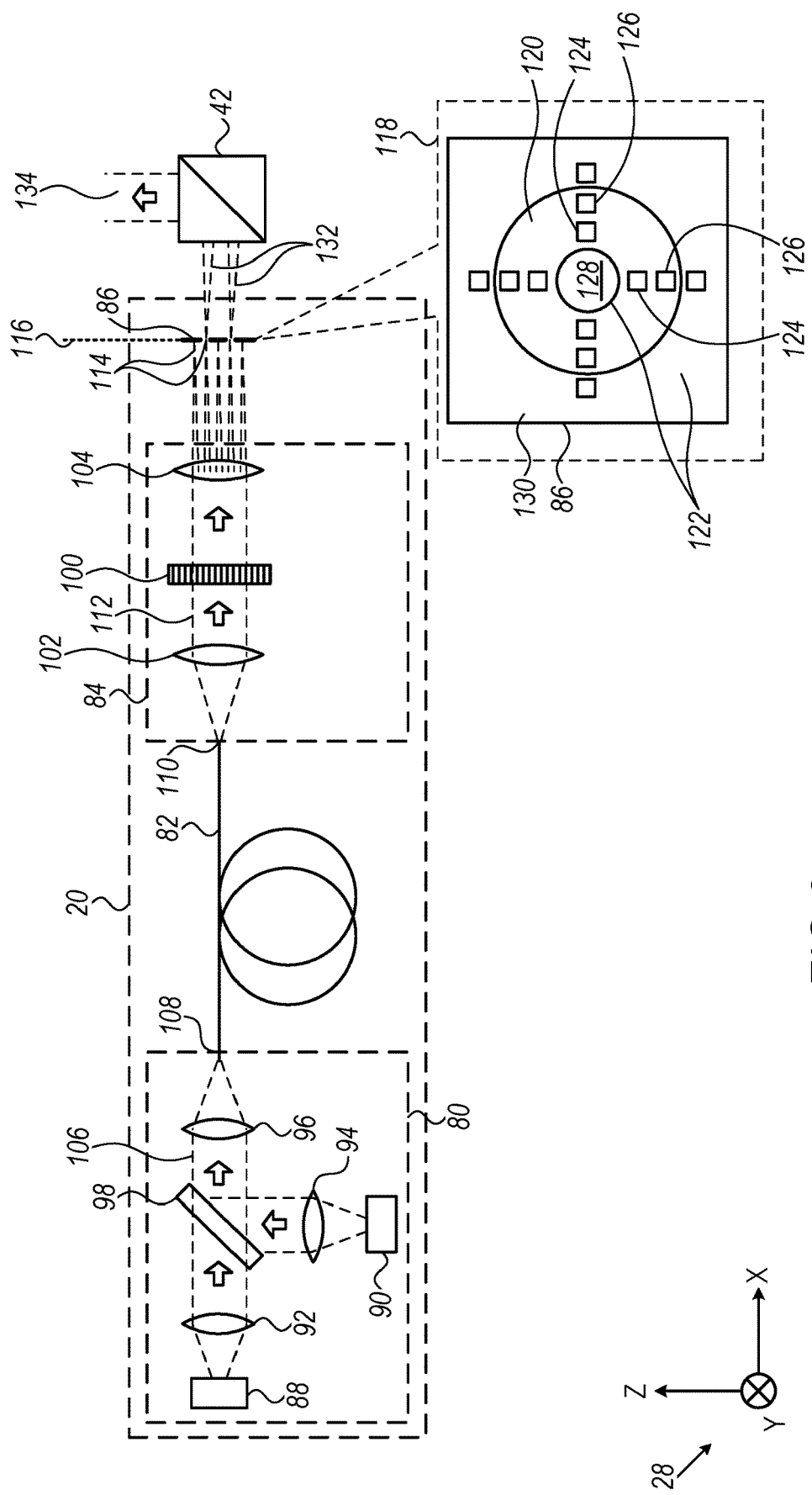
FIG. 2 is a schematic side view of a grating projector used in an optical inspection apparatus, in accordance with an embodiment of the invention.

Grating projector 20 is configured to project a grating image into CAM1 and CAM2, as will be further detailed in FIG. 2. Controller 24 is coupled to grating projector 20, memory 25, table 26, light sources 32 and 33, and to actuators 38, 39, 49, 58, and 60. Controller 24 typically comprises a programmable processor, which is programmed in software and/or firmware to carry out the functions that are described herein, along with suitable digital and/or analog interfaces for connection to the other elements of apparatus 10. Alternatively or additionally, controller 24 comprises hard-wired and/or programmable hardware logic circuits, which carry out at least some of the functions of the controller. Although controller 24 is shown in FIG. 1, for the sake of simplicity, as a single, monolithic functional block, in practice the controller may comprise multiple, interconnected control units, with suitable interfaces for receiving and outputting the signals that are illustrated in the figures and are described in the text.

Before operating optical inspection apparatus 10, semiconductor wafer 12 is mounted on table 26. During the operation, table 26 can, under the control of controller 24, move wafer 12 along the x-, y-, and z-axes, as well as rotate it around the z-axis. The movement along the z-axis is referred to as "focusing."

For illuminating wafer 12, illumination assembly 16 emits beam 43 of optical radiation toward beamsplitter 44, which reflects the beam into objective lens 30. Objective lens 30, in turn, focuses beam 43 onto wafer 12. The cross-section of beam 43 at the exit from illumination assembly 16 in a plane perpendicular to its propagation (in the yz-plane) is modified by suitably placed and aligned apertures of aperture assemblies 36 and 37. These apertures define the shape of the cross-section of beam 43 to be, for example, circular, square, or anamorphic, as well as defining the dimensions of the cross-section. As will be detailed hereinbelow, beam 43 may comprise two beams of different wavelengths and/or polarization states, with aperture assemblies 36 and 37 controlling independently the cross-sections of each of the two beams.

The apertures of assemblies 36 and 37 are typically conjugate to the entrance pupil of objective 30 (imaged by additional optics onto the entrance pupil, with the additional optics omitted from the figure for the sake of simplicity), so that the cross-section of beam 43 exiting from illuminator assembly 16 defines the numerical aperture of the optical radiation illuminating wafer 12. Thus, the shape of the illumination may be, for example, circular, square, or anamorphic in the angular space, and may vary between the full NA of objective 30 and a fraction of the full NA. In some configurations, the illumination may be restricted to NA-values beyond the collection NA of objective lens 30, thus enabling dark-field imaging of the features on wafer 12.

The optical radiation illuminating wafer 12 is reflected by the wafer back toward objective lens 30 for imaging the features on the wafer by the objective toward camera assembly 22. The reflected radiation received by objective lens 30 is further projected through beamsplitters 44 and 45 into beamsplitter assembly 46, where the reflected radiation impinges on either beamsplitter 47 or beamsplitter 48, depending on which of the two beamsplitters has been positioned in its path by actuator 49. Beamsplitter 47 in this example is a wavelength-neutral beamsplitter, i.e., its coefficients of reflection and transmission have the same spectral behavior. Beamsplitter 48 is a dichroic beamsplitter, configured to transmit one spectral band $\Delta\lambda_1$, for example 380-550 nm, and reflect a different (non-overlapping) spectral band $\Delta\lambda_2$, for example 560-800 nm. Thus, when beamsplitter 47 is in the optical path, each of cameras CAM1 and CAM2 receives a portion of the reflected radiation across its whole spectrum; whereas when beamsplitter 48 is in the path, the spectrum of the radiation is split so that CAM1 receives radiation within spectral band $\Delta\lambda_1$, and CAM2 receives radiation within spectral band $\Delta\lambda_2$. Having light source 32 emit optical radiation in spectral band $\Delta\lambda_1$ and light source emit optical radiation in spectral band $\Delta\lambda_2$ allows independent control of the illumination (including illumination NA) for each of the two layers.

Alternatively or additionally, one of beamsplitters 47 and 48 may be a polarizing beamsplitter, transmitting one polarization state and reflecting the orthogonal polarization state. Thus, for example, having light sources 32 and 33 emit optical radiation in orthogonal polarization states, the radiation from light source 32 will be directed to CAM1 and the radiation from light source 33 will be directed to CAM2. Similarly to the spectral division of the illumination described hereinabove, controlling the polarization of the illumination allows independent control of the illumination for each of the two layers. In one embodiment, beamsplitter is a combination of a dichroic and a polarizing beamsplitter.

The optical radiation transmitted and reflected by the selected beamsplitter in assembly 46 is focused by lens 50 onto CAM1 and by lens 52 onto CAM2, respectively. Images of wafer 12 are thus captured by CAM1 and CAM2 and read out and processed by controller 24.

FIG. 2 is a schematic pictorial illustration of grating projector 20, in accordance with an embodiment of the invention. Grating projector 20 projects a grating image toward cameras CAM1 and CAM2, to be utilized as a location reference between the two cameras. Grating projector 20 comprises a light source assembly 80, a single-mode optical fiber 82, a diffractive assembly 84, and a spatial filter 86.

Light source assembly 80 in this example comprises two superluminescent light-emitting diodes (sLEDs) 88 and 90, wherein sLED 88 emits optical radiation at a wavelength $\lambda_1$=450 nm, and sLED 90 emits optical radiation at a wavelength $\lambda_2$=750 nm. Light source 80 further comprises lenses 92, 94, and 96, and a dichroic beamsplitter 98. Alternatively, light sources of other types and wavelengths may be used.

Diffractive assembly 84 comprises a high-contrast transmission diffraction grating assembly 100, such as an assembly of chrome-on-glass gratings, positioned between two lenses 102 and 104. Diffraction grating assembly 100 comprises orthogonal gratings, so as to diffract light in both y- and z-directions. These gratings together create the parts of the grating pattern that is projected by projector 20.

The optical radiation emitted by sLEDs 88 and 90 is projected toward dichroic beamsplitter 98 by respective lenses 92 and 94. Beamsplitter 98 is configured to pass the optical radiation emitted by sLED 88 and to reflect the radiation emitted by sLED 90, thus combining the radiation emitted by the two sLEDs into a single beam 106. Beam 106 is focused by lens 96 into an input end 108 of single-mode optical fiber 82. The optical radiation transmitted through fiber 82 exits from the fiber through its output end 110 into diffractive assembly 84 and is projected by lens 102 toward diffraction grating 100 as a beam 112. Output end 110 is positioned at the focal plane of lens 102, and consequently beam 112 is collimated. Beam 112 is diffracted by grating assembly 100 into collimated diffracted orders 114, which are focused by lens 104 to a focal plane 116.

Spatial filter 86, positioned in focal plane 116, is configured to pass only the $\pm 1^{st}$ orders of the orders 114 diffracted by grating assembly 100. This functionality is shown in detail in an inset 118, showing spatial filter 86 in an yz-view, i.e., from the direction of the x-axis. Spatial filter 86 comprises a transparent annulus 120 on an opaque base 122, for example, a chrome-on-glass base with the chrome removed to form the annulus. The ±1 diffracted orders of the orders 114 are shown within annulus 120 as squares 124 for radiation emitted by sLED 88, and as squares 126 for radiation emitted by sLED 90. The $0^{th}$ diffracted order of the orders 114 is blocked by a central part 128 of spatial filter, and the diffracted orders of the orders 114 beyond the $\pm 1^{st}$ orders are blocked by a peripheral part 130 of spatial filter 86.

After passing spatial filter 86, the $\pm 1^{st}$ diffracted orders of the orders 114 form expanding beams 132. These beams interfere with each other, producing propagating sinusoidal gratings (as interference patterns between the $\pm 1^{st}$ orders), which are reflected by beamsplitter 42 (FIG. 1) into a beam 134. The sinusoidal gratings are further described below with reference to FIG. 3. Beam 134 propagates toward cameras CAM1 and CAM2 collinearly with the optical radiation reflected from wafer 12 (FIG. 1), thus enabling the mutual registration of the two cameras, as will be detailed hereinbelow.

The spectral content of the sinusoidal gratings propagating as beam 134 depends on whether one or both of sLEDs 88 and 90 are energized and emit optical radiation. The emission wavelengths $\lambda_1$ and $\lambda_2$ and the spectral properties of dichroic beamsplitter 48 are matched so that one of the wavelengths is reflected by the beamsplitter and the other is transmitted.

Figure 3:
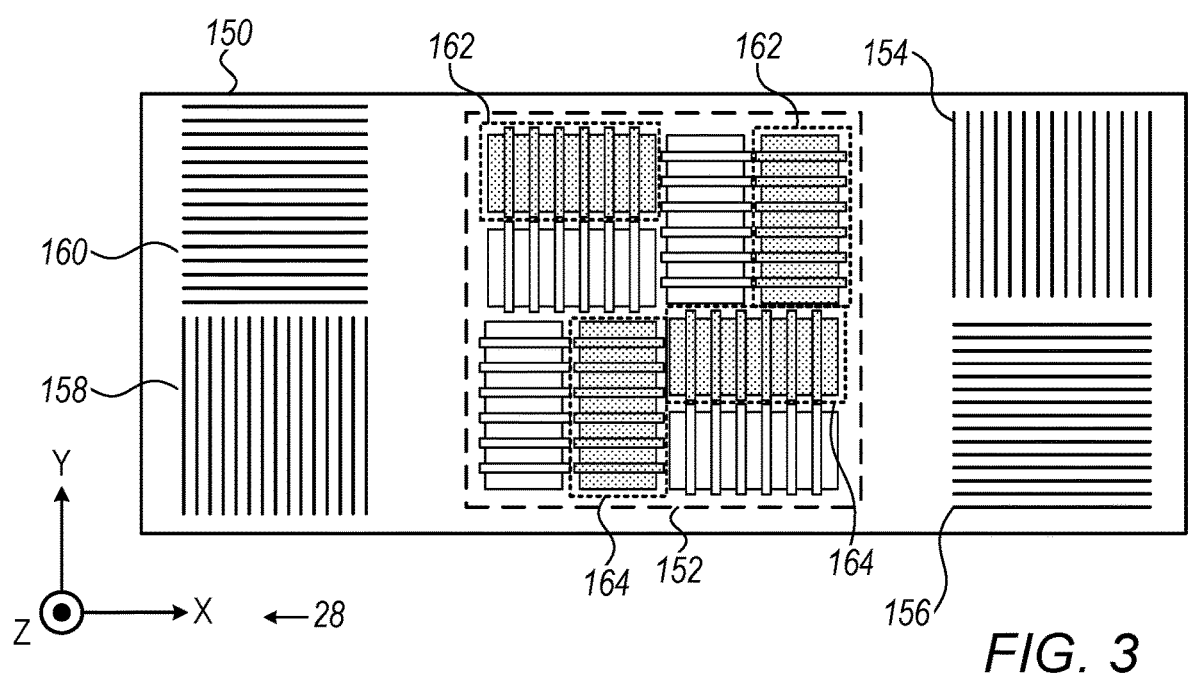
FIG. 3 is a schematic representation of an image acquired by a camera in an optical inspection apparatus, in accordance with an embodiment of the invention.

FIG. 3 is a schematic representation of an image 150 acquired by one of cameras CAM1 or CAM2, in accordance with an embodiment of the invention. Image 150 in this example comprises an AIM™ proxy target 152 and four gratings 154, 156, 158, and 160 projected by grating projector 20 along the image of the proxy target. The target features in AIM™ proxy target 152 comprise four resist gratings 162, oriented pairwise along the x- and y-axes, and four process layer gratings 164, similarly oriented pairwise along the x- and y-axes. For the sake of clarity, only two of resist gratings 162 and two of process layer gratings 164 are outlined, one of each oriented along the x-axis and the other oriented along the y-axis.

Other forms of target features may alternatively be used in proxy targets of other kinds. For example, the target features in so-called frame-in-frame proxy targets comprise square frames of bars.

For the purpose of computing the overlay error between the resist layer and the process layer, controller 24 computes from the image of target 152 the X- and Y-coordinates $(CoS_{X,R}, CoS_{Y,R})$ of the CoS of the resist gratings 162, and similarly the X- and Y-coordinates $(CoS_{X,P}, CoS_{Y,P})$ of the CoS of the process layer gratings 164. The differences between the X-coordinates and between the Y-coordinates of the centers-of-symmetry (projected back to wafer 12) yield the respective X- and Y-overlay errors $OVL_X=(CoS_{X,R}-CoS_{X,P})$ and $OVL_Y=(CoS_{Y,R}-CoS_{Y,P})$. For the sake of brevity, CoS will hereinbelow be used to denote a two-dimensional vector $(CoS_X, CoS_Y)$.

Gratings 154, 156, 158, and 160 are projected by grating projector 20, as described hereinabove (FIG. 2). The spatial splitting and arrangement of the gratings is accomplished by, for example, separating the gratings in diffraction grating assembly 100 into two pairs of orthogonal gratings. Both cameras CAM1 and CAM2 "see" gratings 154, 156, 158, and 160, and controller 24 (FIG. 1) uses these gratings for registering the positions of the two cameras to the gratings in both x- and y-directions. As will be further detailed hereinbelow, this registration is an integral part in the process of accurate registration of consecutive images of target 152.

Characterizing Resist and Process Target Features in an Overlay Metrology Proxy Target The figures that follow show a number of different methods for measuring the variation of CoS of the target features of overlay proxy targets as a function of different imaging parameters, such as focus and illumination wavelength. These methods are described, for the sake of convenience and clarity, with reference to the system structure and components that are described above and shown in the preceding figures and with reference to certain types of proxy targets and their target features. The principles of these methods, however, may similarly be applied, mutatis mutandis, in other overlay metrology systems and using other types of proxy targets, as will be apparent to those skilled in the art after reading the present description. Furthermore, elements of these different methods may be combined to enable multi-factor CoS measurements and calibration. All such alternative implementations are considered to be within the scope of the present invention.

Figure 4:
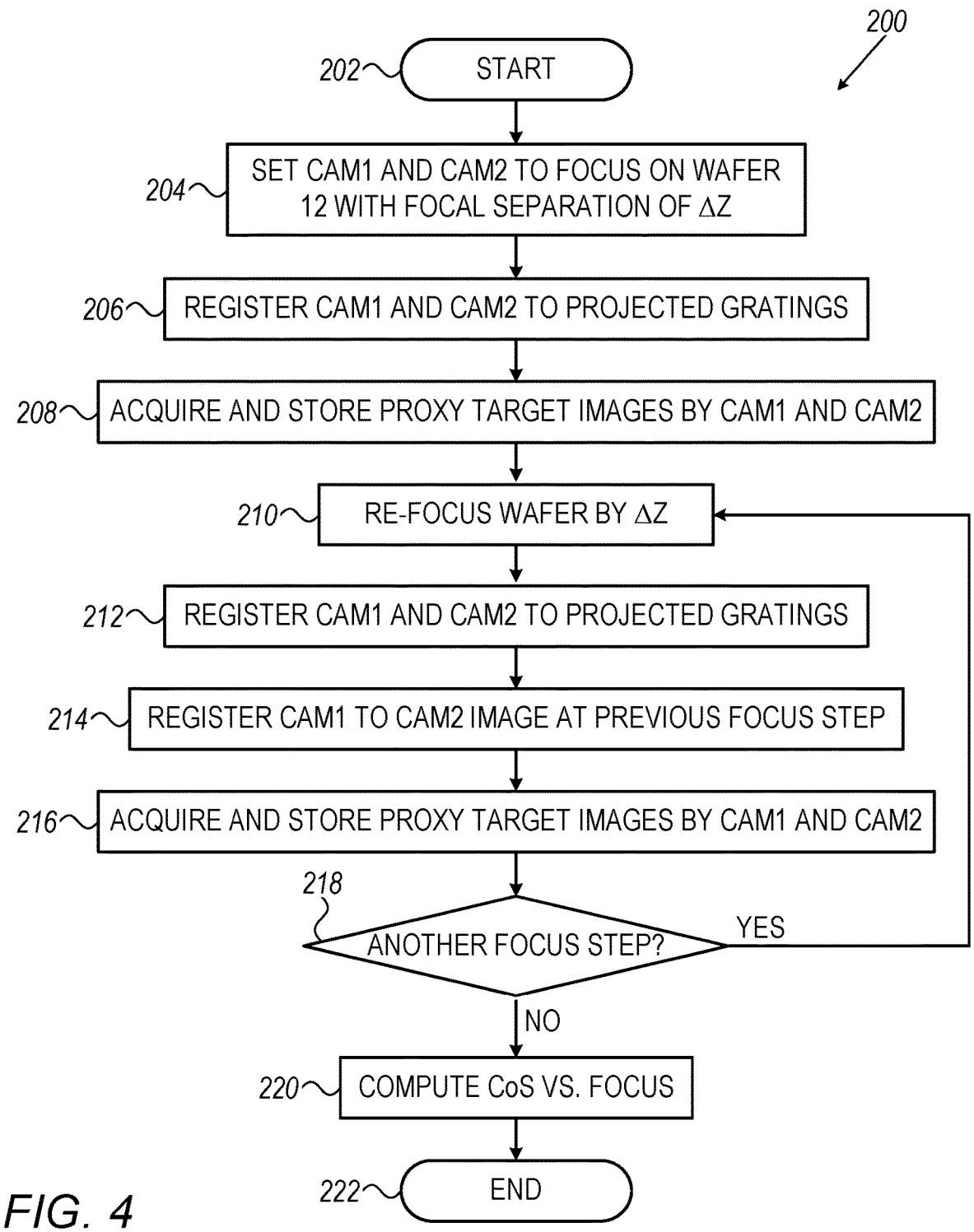
FIG. 4 is a flowchart that schematically illustrates a process for measuring the variation of CoS of process layer and resist layer features of an overlay metrology proxy target, in accordance with an embodiment of the invention.

FIG. 4 is a flowchart 200 that schematically illustrates a process for measuring the variation of CoS of the process layer and resist layer target features of an overlay metrology proxy target as a function of focus, in accordance with an embodiment of the invention. The process refers to optical inspection apparatus 10 described in FIG. 1, with additional reference made to FIGS. 2-3. The objective of the process illustrated in FIG. 4 is to characterize separately the position of the CoS of the target features of each of the layers of an overlay proxy target, such as AIM™ target 152, with respect to the focal setting of wafer 12 within apparatus 10.

The process starts in a start step 202. In a focusing step 204, controller 24 sets cameras CAM1 and CAM2 to focus on wafer 12 by moving table 26 in the z-direction and/or by moving the cameras by actuators 58 and 60. The cameras are set to a focal difference of $\Delta Z$ by differential movement of actuators 58 and 60. (In the present description, focal settings refer to the Z-coordinate in the wafer space. For example, the focal difference $\Delta Z$ refers to focusing of cameras CAM1 and CAM2 at respective xy-planes that are separated by $\Delta Z$ on or in the vicinity of wafer 12.) Further details of the focal separation and focusing of cameras CAM1 and CAM2 are described with reference to FIG. 5 hereinbelow.

In a first grating registration step 206, both cameras CAM1 and CAM2 are registered to gratings 154, 156, 158, and 160 projected by grating projector 20. To perform this registration, controller 24 processes the acquired images of the gratings in order to find the relative position in the x- and y-directions of each camera with respect to the gratings. In order for the cameras to be registered with each other, they may be either physically moved with respect to gratings 154, 156, 158, and 160, or offsets may be computed between the cameras and the gratings and then applied in subsequent processing. Due to the periodic form of the gratings and the repeating structure of pixels in CAM1 and CAM2, controller 24 is able to register each camera with respect to the gratings to an accuracy better than 0.1 nm (with reference to the xy-coordinates in the wafer space). Moreover, since the same gratings are projected toward each camera CAM1 and CAM2, any spatial shifts or vibrations of the projected gratings take place in a common mode for both of the cameras. Since each camera is registered with respect to the same common-mode gratings, the cameras will be registered with each other with an accuracy better than 0.1 nm. In a first acquisition step 208, images of proxy target 152, specifically of gratings 162 and 164, are read out by controller 24 from cameras CAM1 and CAM2 and stored in memory 25.

In a re-focus step 210, table 26 moves wafer 12 in the z-direction by a distance $\Delta Z$, thus bringing CAM1 to the Z-coordinate where CAM2 was before step 210. In a second grating registration step 212, controller 24 again registers each camera CAM1 and CAM2 with gratings 154, 156, 158, and 160, as in first grating registration step 206. The objective of this step is to ensure a continuing registration between the two cameras. In a CAM1 registration step 214, CAM1 is registered to the image acquired by CAM2 in the previous focal position, thus, together with second grating registration step 212, establishing the positions of the two cameras in the xy-plane with respect to the previous focal position. In a second acquisition step 216, images of proxy target 152 are read out by controller 24 through cameras CAM1 and CAM2, and stored in memory 25, similarly to first acquisition step 208.

In a decision step 218, controller 24 decides, based on a pre-set series of focal steps, whether another focal step is required. If the answer is affirmative, the process returns to re-focus step 210 and continues from there. Once all pre-set focal steps have been taken, controller 24 processes the images stored in memory 25 to compute the respective CoS of each of gratings 162 and 164 as a function of the focal settings through the focal steps of $\Delta Z$, in a computation step 220. The process ends in an end step 222.

In some embodiments, the direction at which the illumination impinges on wafer 12 is adjusted in order to compensate for residual optical errors in the imaging optics of the metrology tool. For example, in optical inspection apparatus 10, controller 24 may adjust the position of aperture assembly 36 in the yz-plane through actuator 38 to compensate for residual optical errors in objective lens 30. As the CoS of each of gratings 162 and 164 depends on the position of aperture assembly 36, more comprehensive data may be collected by measuring CoS as a function of focus for multiple positions of aperture assembly 36. In an embodiment, the process described in flowchart 200 is run for a series of Y- and Z-coordinates of aperture assembly, such as $(Y_0 \pm n^*\Delta Y, Z_0 \pm n^*\Delta Z)$, wherein $Y_0$ and $Z_0$ denote a nominal centered position of aperture assembly 36, $\Delta Y$ and $\Delta Z$ denote incremental steps of the aperture assembly, and n is an integer index assuming values from zero to a maximal value of N. The obtained data may be used for further improving the quality of the overlay measurements, as will be described in the section entitled "Selecting measurement conditions" hereinbelow.

Figure 5:
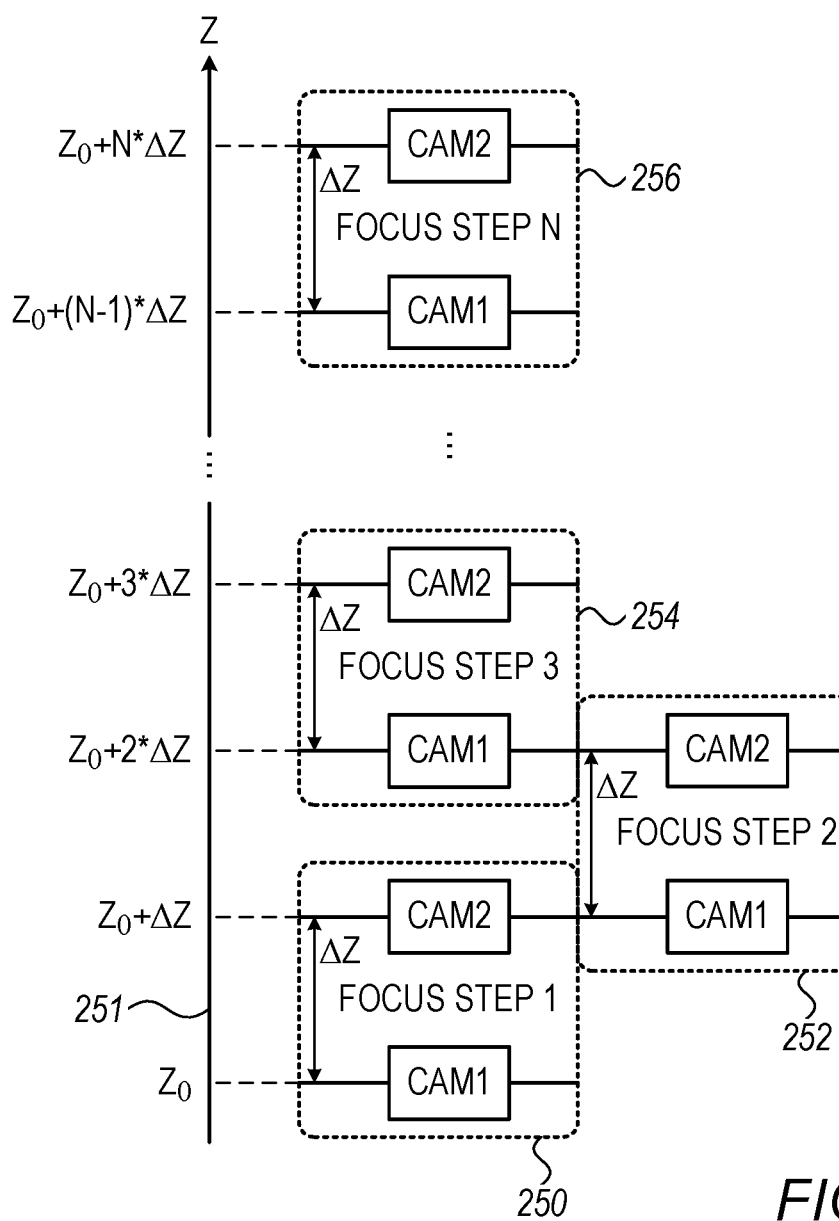
FIG. 5 is a plot that shows schematically the focal separation between two cameras in the process of FIG. 4, in accordance with an embodiment of the invention.

FIG. 5 is a plot that shows schematically the focal separation between CAM1 and CAM2, as well as the focal steps taken in the process of FIG. 4, in accordance with an embodiment of the invention.

The positions of the two cameras CAM1 and CAM2 with respect to the z-coordinate in the wafer space, i.e., in z-coordinates relative to wafer 12 are shifted through N focal steps. In a first step 250, CAM1 is focused at plane $Z=Z_0$, and CAM2 is focused at plane $Z=Z_0+\Delta Z$, as marked on a Z-coordinate axis 251. In a second step 252, the wafer focus is incremented by $\Delta Z$, bringing CAM1 to $Z=Z_0+\Delta Z$ and CAM2 to $Z=Z_0+2\Delta Z$, i.e., CAM1 is now at the same focal position where CAM2 was in first step 250. In a third step 254, the wafer focus is again incremented by $\Delta Z$, bringing CAM1 to $Z=Z_0+2\Delta Z$ and CAM2 to $Z=Z_0+3\Delta Z$. This process continues to the $N^{th}$ step 256, where CAM1 is at $Z=Z_0+(N-1)\Delta Z$ and CAM2 is at $Z=Z_0+N\Delta Z$.

At each focal step, in other words, CAM1 is positioned at the focus where CAM2 was located at the previous step, thus enabling registration between the consecutive steps. This succession of steps, combined with the grating registration steps 206 and 212 (FIG. 4), enables controller 24 to align each camera precisely in the x- and y-directions through focus, and to compute the true CoS of each of gratings 162 and 164 through focus.

Figure 6:
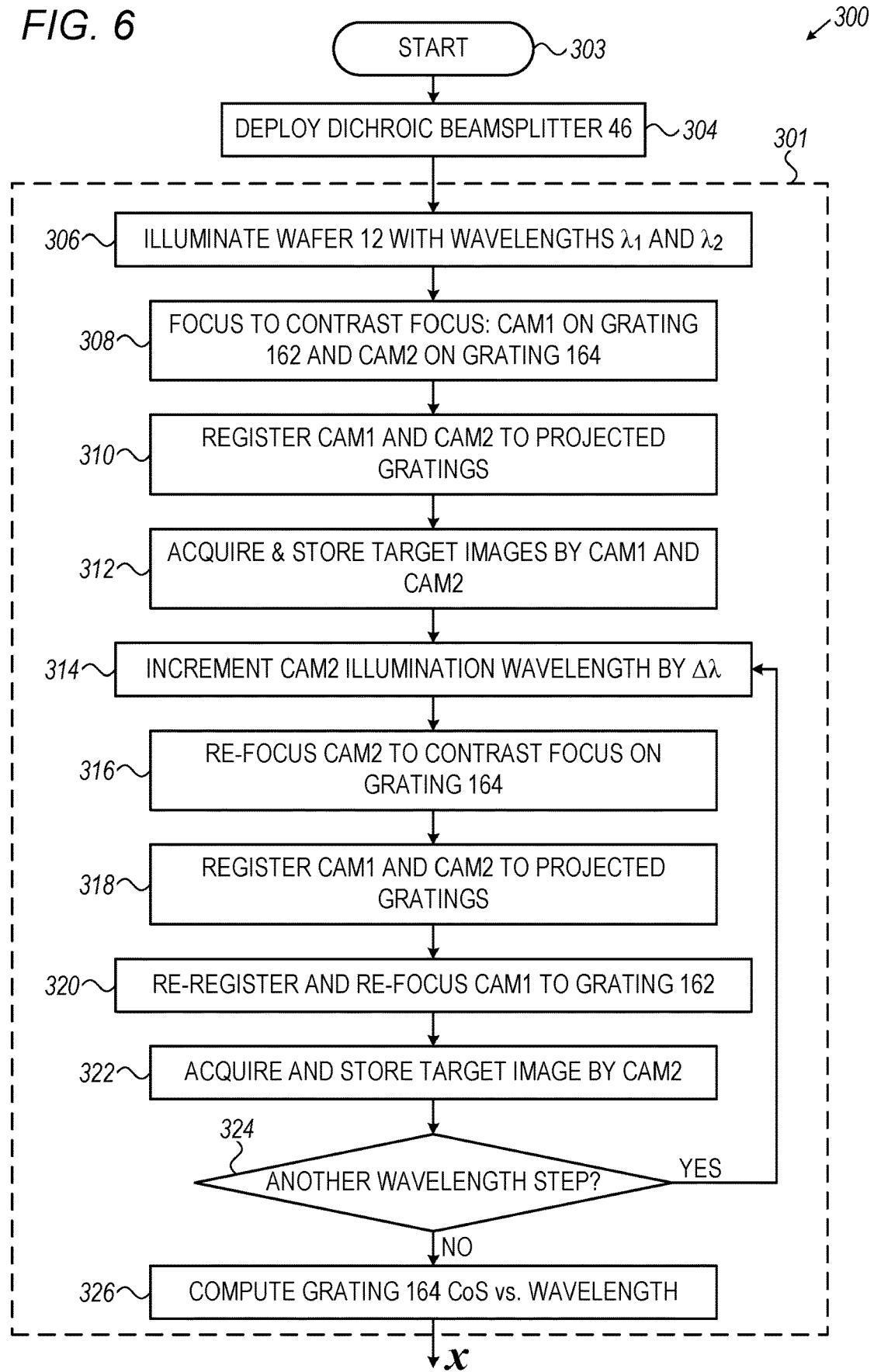
FIG. 6 is a flowchart that schematically illustrates a process for measuring the variation of CoS of the features of an overlay metrology proxy target with respect to wavelength of illumination, in accordance with an embodiment of the invention.
Figure 6:
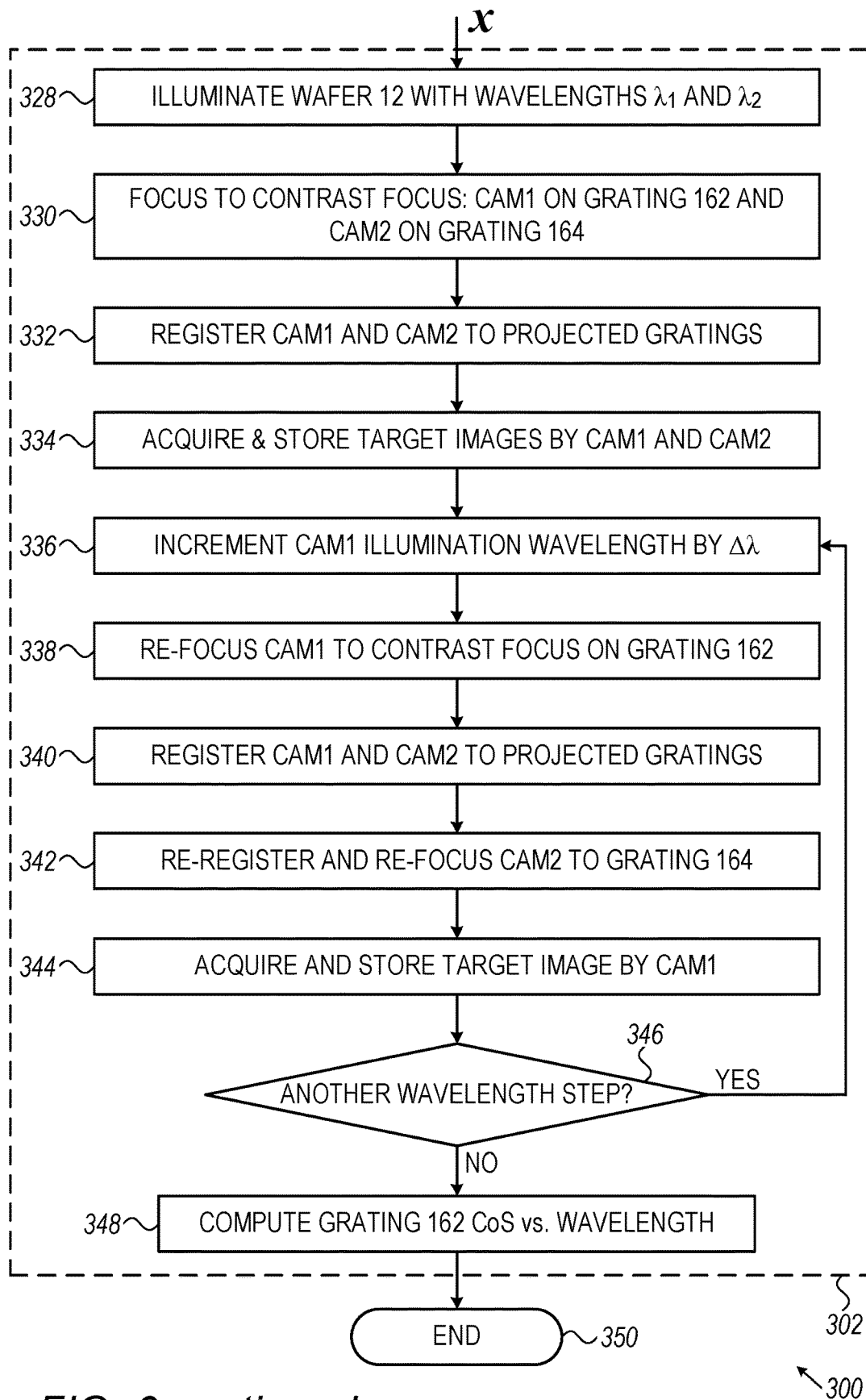

FIG. 6 is a flowchart 300 that schematically illustrates a process for measuring the variation of CoS of the target features of an overlay metrology proxy target with respect to the wavelength of illumination, in accordance with an embodiment of the invention. The process uses optical inspection apparatus 10 shown in FIG. 1, with additional reference made to FIGS. 2-3. The objective of the process illustrated in FIG. 6 is to characterize separately the position of the CoS of each of the target features of an overlay proxy target, such as AIM™ target 152, with respect to the wavelength of the illumination used by apparatus 10. Flowchart 300 comprises a first part 301 and a second part 302 for computing, respectively, the CoS of grating 164 and of grating 162 as a function of the illumination wavelength.

The process starts in a start step 303. In a beamsplitter deployment step 304, controller 24 energizes actuator 49 to bring dichroic beamsplitter 46 into the optical path of apparatus 10, thus splitting the optical radiation in the optical path of apparatus 10 so that CAM1 receives a part of the radiation within spectral band $\Delta\lambda_1$, and CAM2 receives a part of the radiation within spectral band $\Delta\lambda_2$.

The process then enters first part 301. In a first illumination step 306, semiconductor wafer 12 is illuminated with wavelengths $\lambda_1$ and $\lambda_2$, wherein wavelength $\lambda_1$ is within spectral band $\Delta\lambda_1$, and wavelength $\lambda_2$ is within spectral band $\Delta\lambda_2$, with light source 32 emitting optical radiation at wavelength $\lambda_1$ and light source 33 emitting optical radiation at wavelength $\lambda_2$. In a first focusing step 308, controller 24 focuses, using table 26 and actuators 58 and 60, camera CAM1 to a contrast focus on grating 162 and CAM2 to a contrast focus on grating 164. The term "contrast focus" refers to the focal position at which the grating image on the respective camera exhibits a maximum contrast C. Contrast C, in turn, is defined based on the maximum and minimum intensities $I_{max}$ and $I_{min}$ of the grating image on a given camera as $C=(I_{max}-I_{min})/(I_{max}+I_{min})$. In a first grating registration step 310, cameras CAM1 and CAM2 are registered with respect to projected gratings 154, 156, 158, and 160, similarly to first grating registration step 206 (FIG. 4). In a first acquisition step 312, images of gratings 162 and 164 are then acquired by cameras CAM1 and CAM2, read out by controller 24 from the cameras, and stored in memory 25.

In a first wavelength change step 314, controller 24 increments the wavelength of the optical radiation emitted by light source 33 into spectral band $\Delta\lambda_2$ by $\Delta\lambda$, thus changing the wavelength of the illumination reaching CAM2 from $\lambda_2$ to $\lambda_2+\Delta\Delta$. In a first re-focus step 316, CAM2 is re-focused to a contrast focus at the incremented wavelength. In a second grating registration step 318, cameras CAM1 and CAM2 are registered with respect to gratings 154, 156, 158, and 160 as in first grating registration step 310. In a re-registration step 320, CAM1 is re-focused and re-registered to the same image of grating 162 that was acquired through CAM1 in acquisition step 312. Thus, CAM1 is established as an "anchor" for part 301, as it is continually registered to the same physical grating 162 at the same wavelength and the same focus. In a second acquisition step 322, an image of grating 164 is acquired by CAM2, read out from the camera by controller 24, and stored in memory 25.

In a first decision step 324, controller 24 determines, based on a pre-set series of wavelength steps, whether another wavelength step is required in spectral band $\Delta\lambda_2$. If the answer is affirmative, the process returns to first wavelength change step 314, incrementing the wavelength of the illumination reaching CAM2 again by $\Delta\lambda$, and continuing the process. When all pre-set wavelength steps have been exhausted, controller 24 computes, in a first computation step 326, based on the images stored in memory 25, the CoS of grating 164 as a function of wavelength through the wavelength steps $\Delta\lambda$ in spectral band $\Delta\lambda_2$.

The process continues to second part 302, described in detail in order to clarify the difference between first and second parts. Steps 328, 330, 332, 334, 340, and 346 in second part 302 are identical to the respective steps 306, 308, 310, 312, 318, and 324 in first part 301. However, steps 336, 338, 342, and 344 in second part 302 differ from their counterparts 314, 316, 320, and 326 in first part 301, as in these steps of the second part the spectral scanning takes place through spectral range $\Delta\lambda_1$ rather than through spectral range $\Delta\lambda_2$ as in the first part.

In a second illumination step 328, semiconductor wafer 12 is illuminated with wavelengths $\lambda_1$ and $\lambda_2$. In a second focusing step 330, controller 24 focuses camera CAM1 to a contrast focus on grating 162 and CAM2 to a contrast focus on grating 164. In a third grating registration step 332, cameras CAM1 and CAM2 are registered with respect to gratings 154, 156, 158, and 160. In a third acquisition step 334, images of gratings 162 and 164 are acquired by cameras CAM1 and CAM2, read out by controller 24 from the cameras, and stored in memory 25.

In a second wavelength change step 336, controller 24 increments the wavelength of the optical radiation emitted by light source 32 into spectral band $\Delta\lambda_1$ by $\Delta A$. In a second re-focus step 338, CAM1 is re-focused to a contrast focus at the incremented wavelength $\Delta\lambda_1+\Delta A$. In a fourth grating registration step 340, cameras CAM1 and CAM2 are registered with respect to gratings 154, 156, 158, and 160. In a second re-registration step 342, CAM2 is re-focused and re-registered with respect to the same image of grating 164 that was read out from CAM2 in third acquisition step 334, thus establishing CAM2 as the anchor for second part 302. In a fourth acquisition step 344, an image of grating 162 is acquired by camera CAM1, read out by controller 24 from the camera, and stored in memory 25.

In a second decision step 346, controller 24 determines, based on a pre-set series of wavelength steps, whether another wavelength step is required within spectral band $\Delta\lambda_1$. If the answer is affirmative, the process returns to second wavelength change step 336, incrementing the wavelength of the illumination reaching CAM1 again by $\Delta\lambda$ and continuing the process. When all pre-set wavelength steps have been taken, controller 24 computes, in a second computation step 348, the CoS of grating 162 as a function of wavelength through the wavelength steps $\Delta\lambda$ in spectral band $\Delta\lambda_1$. The process ends in an end step 350.

Similarly to the measurement of the variation of CoS with respect to focus, the obtained data for variation of CoS with respect to wavelength may be used for further improving the quality of the overlay measurements, as will be described in the section entitled "Selecting measurement conditions" hereinbelow.

Measuring the variation of CoS with respect to wavelength of illumination may also be performed with the polarization state of the optical radiation as an additional parameter. In an embodiment, the variation of CoS with respect to wavelength is measured for various states of the polarization of the illumination impinging on wafer 12. Thus, controller 24 commands light sources 32 and 33 to emit optical radiation in two orthogonal polarization states, and the variation of CoS with respect to wavelength of illumination is measured separately for each polarization state. In an alternative embodiment, wafer 12 is illuminated with unpolarized optical radiation, and a specific state of polarization reaching each of the two cameras CAM1 and CAM2 is determined either by dichroic beamsplitter 46 also functioning as a polarizer, or by suitably positioned polarizers between the dichroic beamsplitter and the two cameras.

Figure 7:
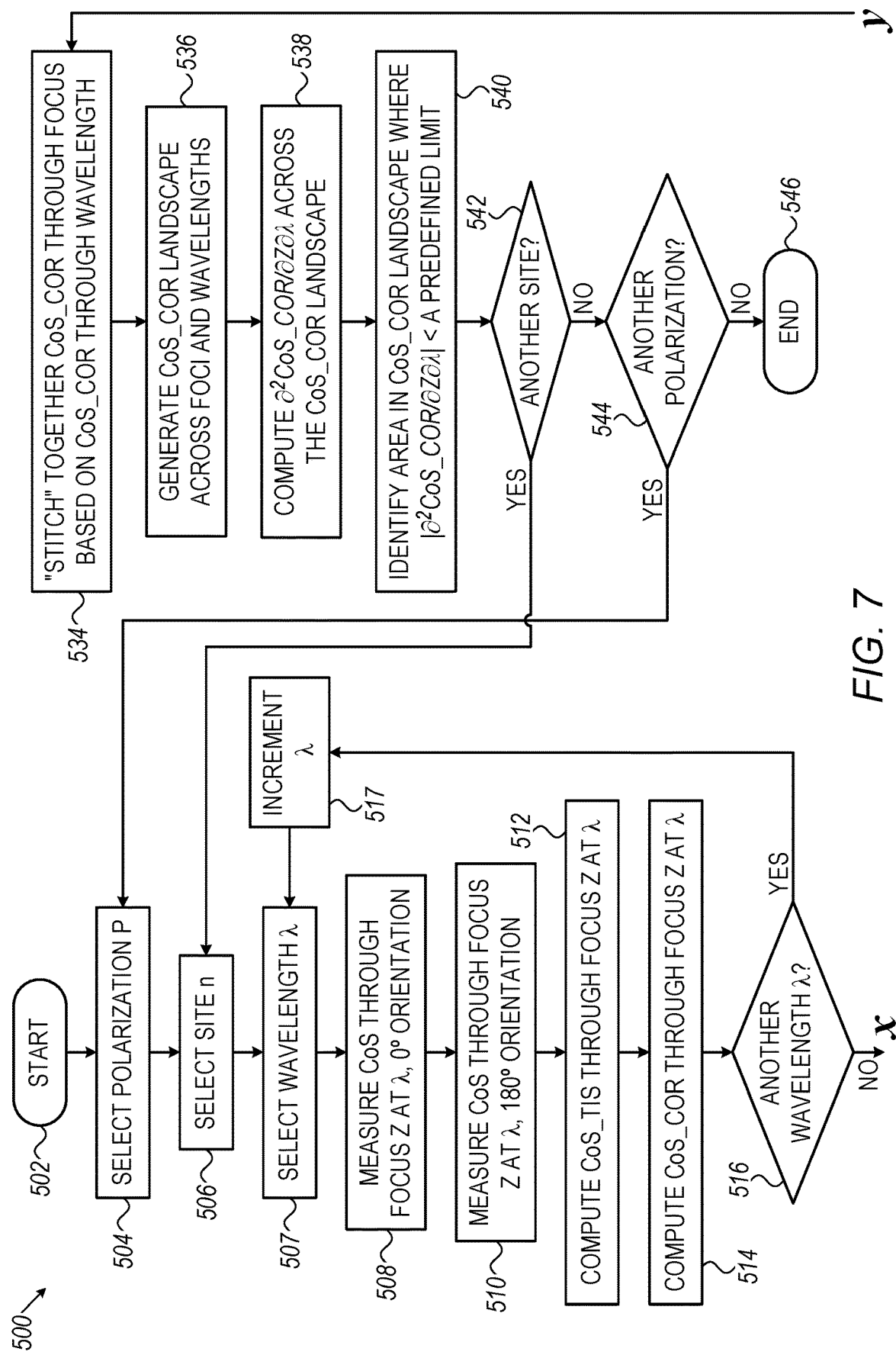
FIG. 7 is a flowchart that schematically illustrates a process for generating and evaluating landscapes and sensitivities of CoS across focal settings and wavelengths, in accordance with an embodiment of the invention.
Figure 7:
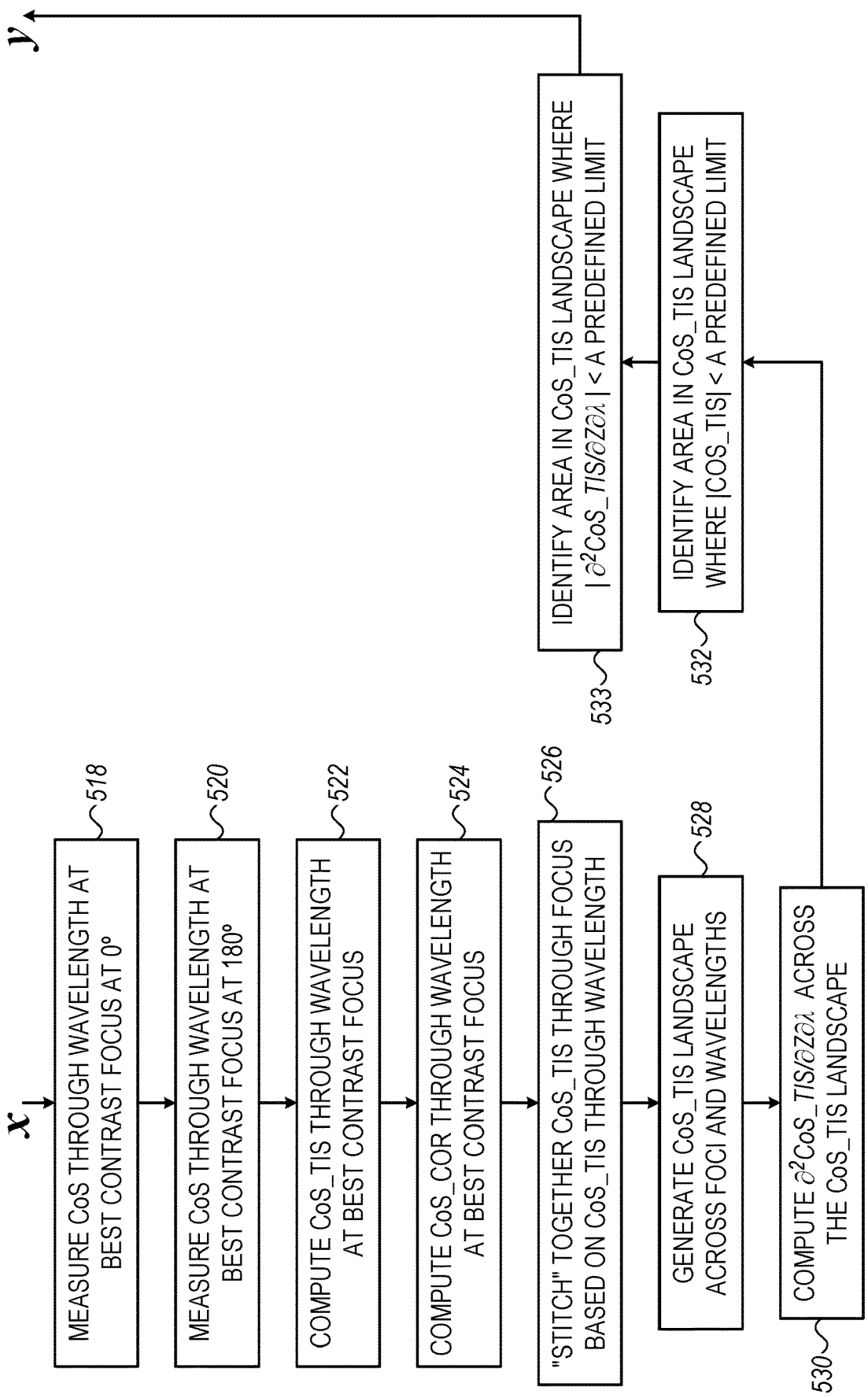

FIG. 7 is a flowchart 500 that schematically illustrates a process for generating and evaluating landscapes and sensitivities of CoS across focal settings and wavelengths, in accordance with an embodiment of the invention.

In order to capture scanner-induced overlay errors, such as misplacement and rotation of wafer 12 within the scanner, as well as scanner field distortions, overlay error is commonly measured at several measurement sites on the wafer. The process shown in flowchart 500 relates to measurements on N sites on wafer 12, wherein the sites are indexed by n (n=1, 2, ... N). Furthermore, the process is run for both the resist layer and the process layer.

CoS is measured with respect to focus in two orientations of wafer 12, wherein for the second orientation the wafer is rotated by 180° around the Z-axis. Denoting CoS with respect to focus as $CoS_0(Z)$ for the first orientation (arbitrarily set as 0° orientation), and as $CoS_{180}(Z)$ for the second orientation, a tool-induced shift (TIS) of CoS, CoS_TIS, is computed by controller 24 as CoS_TIS(Z)=($CoS_0(Z)$+$CoS_{180}(Z)$)/2. CoS_TIS describes an error in CoS due to asymmetry of the optical components in the imaging path of apparatus 10, such as asymmetry of objective lens 30. A corrected CoS, wherein CoS_TIS has been subtracted from the measured CoS, may be computed by controller 24 as CoS_COR(Z), wherein CoS_COR(Z)=[$CoS_0(Z)$−$CoS_{180}(Z)$]/2 and "COR" denotes "corrected." As mentioned hereinabove, CoS denotes a two-dimensional vector ($CoS_x$, $CoS_y$), i.e., the notation "CoS" includes both its X- and Y-coordinates.

Inaccuracies of the measurements of CoS due to mechanical vibrations of apparatus 10 may be reduced by acquiring the images of proxy target 152 multiple times and averaging the measurement results.

The process starts in a start step 502. In a polarization selection step 504, the polarization state (or states) of the illumination emitted by illumination assembly 16 is selected. In a site selection step 506, a site n on wafer 12 is selected. In a wavelength selection step 507, wavelength λ is selected. In a 0-degree CoS-through-focus step 508, CoS is measured through the focus Z as described in reference to FIGS. 4-5. In a 180-degree CoS-through-focus step 510, the above measurement is repeated, but with wafer 12 in an orientation that is rotated by 180° with respect to step 508. In a first CoS_TIS step 512, CoS_TIS is computed by controller 24 from the respective values of CoS at 0°- and 180°-orientations for each focal setting Z as CoS_TIS=($CoS_0$+$CoS_{180}$)/2. For the sake of simplicity, the explicit dependence on focus Z, wavelength λ, polarization P, and site n have been omitted from these formulas. In a first CoS_COR step 514, CoS_COR is computed by controller 24 from the respective values of CoS at 0° and 180° for each focal setting Z as CoS_COR=($CoS_0$−$CoS_{180}$)/2. (Again, explicit references to the variables have been omitted.) In a wavelength decision step 516, controller 24 decides, based on a preset list of wavelengths, whether steps 507-514 should be run again. In case of an affirmative answer, wavelength λ is incremented in a wavelength incrementation step 517, and the process continues from step 507.

When all preset wavelengths have been exhausted, the process continues to measuring CoS with respect to wavelength at best contrast focus, as described in reference to FIG. 6. Although CoS has been measured with respect to focus at all required wavelengths in the previous steps, a drift of apparatus 10 may have caused some of the results of CoS with respect to focus to drift in the focal coordinate Z. As will be detailed hereinbelow, measuring CoS with respect to wavelength will be used to correct for drifts of this kind.

In a 0-degree CoS-through-wavelength step 518, CoS is measured through a preset spectrum of wavelengths at best contrast focus. In a 180-degree CoS-through-wavelength step 520, the above measurement is repeated, but with wafer 12 in an orientation that is rotated by 180° with respect to step 516. In a second CoS_TIS step 522 and in a second CoS_COR step 524, CoS_TIS and CoS_COR are computed by controller 24 from the data acquired in steps 518 and 520 as described in reference to respective steps 512 and 514 hereinabove.

In a CoS_TIS stitch step 526, controller 24 compares, for each wavelength λ, the result for CoS_TIS through focus from steps 507-516, with focus Z at the best contrast focus, to the result for CoS_TIS from step 522. If there is a discrepancy between the two results, the results for CoS_TIS through focus for wavelength λ are shifted in the focal coordinate Z so as to remove the discrepancy. This "stitches" the results of CoS_TIS through focus for adjacent wavelengths into a consistent representation of CoS_TIS in the two-dimensional Z-A space, as will be further detailed in reference to FIG. 8a hereinbelow. In a CoS_TIS landscape step 528, controller 24 collects this representation into a collection of CoS_TIS values against the two variables Z and A. This collection is referred to as the CoS_TIS landscape.

In a CoS_TIS derivative step 530, controller 24 computes the value for the second derivative $\partial^2 CoS\_TIS/\partial Z \partial \lambda$' indicating the sensitivity of CoS_TIS with respect to variations in the variables Z and λ. In a minimal CoS_TIS step 532, controller 24 identifies in the CoS_TIS landscape a two-dimensional area (or multiple areas) in the (Z,λ)-plane in which the absolute values of CoS_TIS are less than a predefined limit, thus indicating an area of minimal tool-induced shift for CoS, i.e., a minimal error in CoS. (The X- and Y-components of the CoS_TIS may be assigned different limits.) In a minimal CoS_TIS derivative step 533, controller 24 identifies in the CoS_TIS landscape a two-dimensional area (or multiple areas) in the (Z,λ)-plane in which the absolute values of $\partial^2 CoS\_TIS/\partial Z \partial \lambda$ are less than another predefined limit, thus indicating an area of highest stability for CoS_TIS.

Similarly to CoS_TIS stitch step 526, in a CoS_COR stitch step 534, controller 24 compares, for each wavelength λ, the result for CoS_COR through focus from steps 507-516, with focus Z at the best contrast focus, to the result for CoS_COR from step 524. If there is a discrepancy between the two results, the results of CoS_COR through focus for wavelength λ are shifted in the focal coordinate Z so as to remove the discrepancy. This "stitches" the results of CoS_COR through focus for adjacent wavelengths into a consistent representation of CoS_COR in the Z-A space.

Similarly to CoS_TIS landscape step 528, in a CoS_COR landscape step 536, controller 24 collects this representation into a collection of CoS_COR values against the two variables Z and λ, referred to herein as the CoS_COR landscape. In a CoS_COR derivative step 538, controller 24 computes the value for the second derivative $\partial^2 CoS\_TIS/\partial Z \partial \lambda$' indicating the sensitivity of CoS_COR with respect to changes in the variables Z and λ.

In a minimal CoS_COR derivative step 540, controller 24 identifies in the CoS_COR landscape the two-dimensional area (or multiple areas) in which the absolute values of $\partial^2 CoS\_TIS/\partial Z \partial \lambda$ are less than yet another predefined limit, thus indicating an area of highest stability for CoS_COR. (As CoS_COR may have an arbitrary offset from zero, there is no rationale for identifying areas in which CoS_COR is less than a predefined limit.)

In a site decision step 542, controller 24 verifies whether additional sites n on wafer 12 need to be measured. If the result is affirmative, the process returns to step 506, selecting the next site. When all sites have been measured (for the current polarization), controller 24 verifies in a polarization decision step 544 whether measurements need to be performed at additional polarization states of the illumination. If the result is affirmative, the process returns to step 504, and measures again all N sites using a new polarization state of illumination. When all required polarization states have been exhausted, the process ends in an end step 546.

Figure 8C:
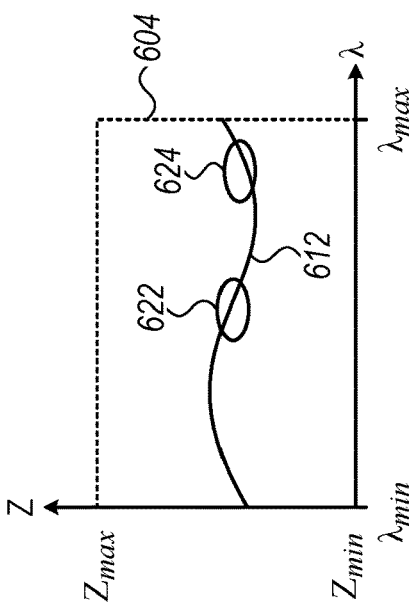
FIGS. 8a-8d are schematic representations of landscapes of tool-induced shift of CoS (CoS_TIS) and corrected CoS (CoS_COR) for resist and process layers, in accordance with an embodiment of the invention.
Figure 8D:
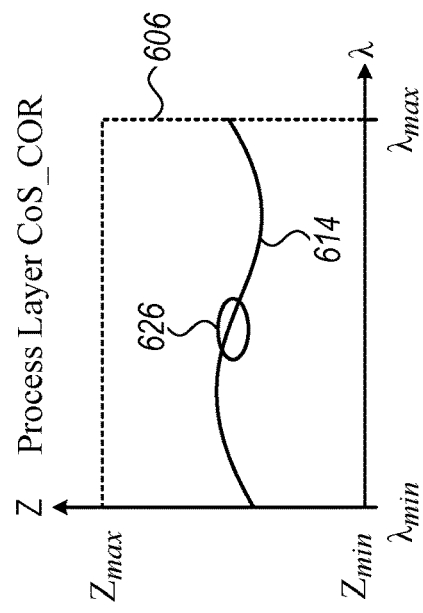
Figure 8A:
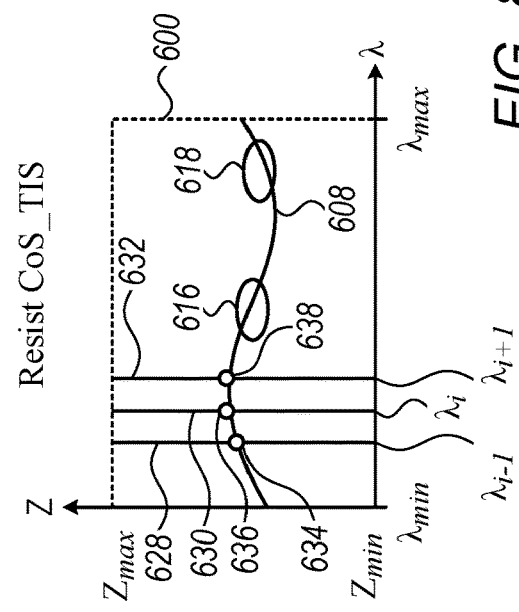
Figure 8B:
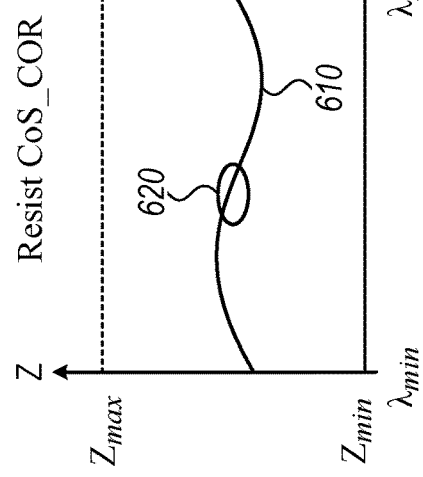

FIGS. 8a-8d are schematic representations of CoS_TIS and CoS_COR landscapes for resist and process layers, in accordance with an embodiment of the invention. FIG. 8a shows a CoS_TIS landscape 600 for the resist layer, FIG. 8b shows a CoS_COR landscape 602 for the resist layer, FIG. 8*c* shows a CoS_TIS landscape 604 for the process layer, and FIG. 8*d* shows a CoS_COR landscape 606 for the process layer. Each landscape 600, 602, 604, and 606 pertains to a given site n and for a given polarization P. Similar landscapes are generated for all N sites and all polarization states of the illumination. Each landscape represents the respective values of CoS_TIS or CoS_COR in a wavelength range ($\lambda_{min}$, $\lambda_{max}$) and a focal range ($Z_{min}$, $Z_{max}$). Curves 608, 610, 612, and 614 show the focal positions of best contrast focus with respect to wavelength for respective landscapes 600, 602, 604, and 606.

The areas identified in steps 532, 533, and 540 of FIG. 7 are shown in landscapes 600-606. Thus, within an area 616, $\partial^2 CoS\_TIS/\partial Z \partial \lambda$ is less than a predefined limit $L_1$, and within an area 618, CoS_TIS is less than a predefined limit $L_2$. Within an area 620, $\partial^2 CoS\_TIS/\partial Z \partial \lambda$ is less than a predefined limit $L_3$. Within an area 622, $\partial^2 CoS\_TIS/\partial Z \partial \lambda$ is less than a predefined limit $L_4$, and within an area 624, CoS_TIS is less than a predefined limit $L_5$. Within an area 626, $\partial^2 CoS\_TIS/\partial Z \partial \lambda$ is less than a predefined limit $L_6$. Thus, areas 616 and 622 indicate areas of high stability for CoS_TIS for the resist and process layers, respectively, whereas areas 618 and 624 indicate low values of CoS_TIS, i.e., low measurement tool errors for these layers. Areas 620 and 626 indicate a high stability for CoS_COR for the resist layer and the process layer respectively.

The concept of "stitching", introduced in steps 526 and 534 of FIG. 7, is schematically illustrated in FIG. 8*a*. Three lines 628, 630, and 632 denote three paths along which CoS_TIS as a function of focus Z has been measured according to steps 507-516 of FIG. 7 at respective wavelengths $\lambda_{i-1}$, $\lambda_i$, and $\lambda_{i+1}$. Three points 634, 636, and 638 on curve 608 indicate where CoS_TIS as a function of wavelength $\lambda$ has been measured at steps 518-522 of FIG. 7. The value of CoS_TIS on line 628, where this line crosses curve 608, is compared to the value of CoS_TIS at point 634. If the two values are the same, line 628 is not shifted. However, if the values do not agree, line 628 (together with its CoS_TIS-values) is shifted along the Z-direction until the value on line 628 at the crossing with curve 608 agrees with the value at point 634. A similar process is repeated for line 630 with respect to point 636, and for line 632 with respect to point 638.

Once these three lines 628, 630, and 632 have been, where necessary, shifted so that the values at the crossing of each line with curve 608 agrees with the value at the respective point 634, 636, and 638, the lines are said to be "stitched" together. This process is repeated for all similar lines from $\lambda_{min}$ to $\lambda_{max}$ thus correcting for possible drifts of apparatus 10 during the measurement of the CoS_TIS values through focus. Similar stitching operations are applied to landscapes 602, 604, and 606.

Figure 9B:
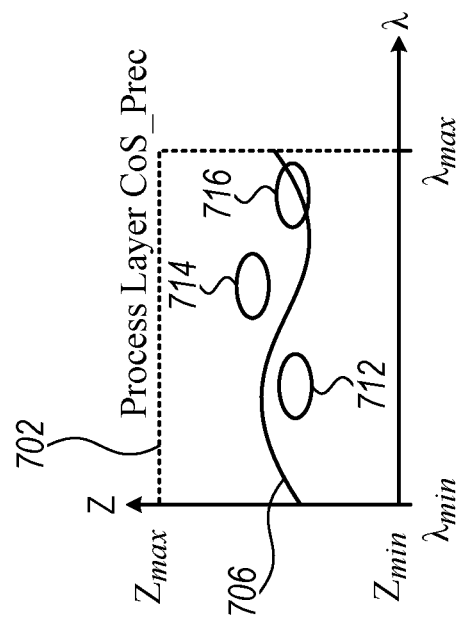
FIGS. 9a and 9b are schematic representations of precision landscapes for resist and process layers, in accordance with an embodiment of the invention.
Figure 9A:
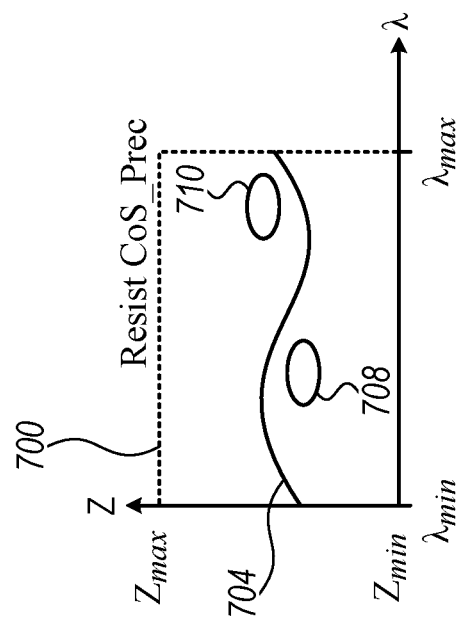

FIGS. 9*a* and 9*b* are schematic representations of precision landscapes for resist and process layers, in accordance with an embodiment of the invention. In this embodiment, the precision of the CoS-measurement is evaluated. Precision measurement comprises several consecutive measurements of CoS, for example, five, ten or fifteen measurements, and computing a metric for the precision. A common metric is the 3σ-value (three times standard deviation) of the measurements. In an embodiment, wherein precision for CoS (labelled CoS Prec) has been measured during the measurements described hereinabove (FIGS. 5-7), a precision landscape is generated with respect to the two variables of focus Z and wavelength $\lambda$.

A landscape 700 in FIG. 9*a* represents the precision of CoS of the resist layer, and a landscape 702 in FIG. 9*b* represents the precision of CoS of the process layer. Each landscape, similarly to landscapes 600, 602, 604, and 606 of respective FIGS. 8*a*, 8*b*, 8*c*, and 8*d*, represents the respective values of CoS Prec in a wavelength range ($\Delta_{min}$, $\Delta_{max}$) and a focal range ($Z_{min}$, $Z_{max}$). Landscapes 700 and 702 comprise respective curves 704 and 706, showing the focal positions of best contrast focus with respect to wavelength. From the values of CoS Prec for the resist layer in landscape 700, controller 24 has identified areas 708 and 710, wherein CoS Prec comprises values below a preset limit $L_7$. Similarly, from the values of CoS Prec for the process layer in landscape 702, controller 24 has identified areas 712, 714, and 716, wherein CoS Prec comprises values below a preset limit of $L_g$.

Selecting Measurement Conditions

The metrology recipe, i.e., the settings of various parameters (for example, focus, wavelength, polarization) of apparatus 10 during overlay metrology, can have a significant impact on the quality of the metrology results. As will be detailed hereinbelow, the user of apparatus 10 can choose the measurement conditions to vary in order to reach a desired balance between different factors, such as, for example, stability and accuracy. The layer-specific characterization of the metrology results, illustrated in FIGS. 4-9, give the user a sophisticated set of tools with which to select the measurement conditions with the user's specific goals in mind. Two example embodiments illustrating the use of these tools are given hereinbelow.

Embodiment 1—In this embodiment, a metric $M_1$ is computed by controller 24 for each layer from landscapes 600, 602, 604, and 606 (FIGS. 8*a*-8*d*) and from landscapes 700 and 702 (FIGS. 9*a*-9*b*), for all measurement sites and all polarizations:

$$M_1(\lambda, Z, P, L) = AVG_N\left(\sqrt[2]{\begin{array}{c}Prec^2(\lambda, Z, P, L) + \\ CoS\_TIS^2(\lambda, Z, P, L)\end{array}}\right) + 3\sigma_N\left(\sqrt[2]{\begin{array}{c}Prec^2(\lambda, Z, P, L) + \\ CoS\_TIS^2(\lambda, Z, P, L) + \\ CoS\_COR^2(\lambda, Z, P, L)\end{array}}\right)$$

The variables in the metric as well as in its components are wavelength $\lambda$, focal coordinate Z, polarization state P of the illumination, and the layer L (either resist layer or process layer). $AVG_N$ refers to an average over the N measured sites, and $3\sigma_N$ refers to three times the standard deviation over the N sites, with $AVG_N$ and $3\sigma_N$ taking into account the impact of process variations on the landscapes across the sites and polarizations. For the sake of brevity, precision has been denoted by "Prec."

As the metric $M_1$ comprises CoS_TIS as its contributor, it is weighted towards evaluating the accuracy (tool-induced error) of the measurement. By finding the measurement conditions for which $M_1(\lambda,Z,P,L)<\text{LIMIT}(M_1)$, wherein $\text{LIMIT}(M_1)$ is a predefined limit for $M_1$, the measured overlay error will exhibit a minimal tool-induced error.

For apparatus 10 with two illuminators 15 and 17 (FIG. 1), the measurement conditions may be optimized for each layer independently through the use of a layer-specific metric $M_1$. Were apparatus 10 to comprise only one illuminator, a compromise between the measurement conditions for the two layers would be found. For example, a possible requirement for a single-illuminator apparatus is:

$$M_1(\lambda,Z,P,L_{resist})+M_1(\lambda,Z,P,L_{process})<\text{LIMIT}'(M_1),$$

wherein $L_{resist}$ and $L_{process}$ refer to the resist and process layers, respectively, and wherein LIMIT'($M_1$) is (another) predefined limit.

Were CoS_TIS a constant correction factor for a tool, it could be calibrated by a one-time calibration procedure. However, due to the coupling between the local geometry of the target features of a proxy target and the optical response of the metrology tool optics, CoS_TIS can vary from target to target when multiple sites on the wafer are measured. This sort of CoS_TIS variation can arise as the result of a process variation across the wafer.

The contribution of CoS_TIS to metric $M_1$ may be reduced for each of the layers by lateral shifts of the apertures of the respective aperture assemblies 36 and 37.

Embodiment 2—In this embodiment, a metric $M_2$ is computed by controller 24 for each layer using the same landscapes as for metric $M_1$. However, the formulation of metric $M_2$ differs from that of metric $M_1$:

$$M_2(\lambda, Z, P, L) = \\ AVG_N \left( \sqrt[2]{\left(\frac{\partial^2 \text{CoS\_COR}(\lambda, Z, P, L)}{\partial Z \partial \lambda}\right)^2 + \left(\frac{\partial^2 \text{CoS\_TIS}(\lambda, Z, P, L)}{\partial Z \partial \lambda}\right)^2 + Prec^2(\lambda, Z, P, L)} \right) \\ 3\sigma_N \left( \sqrt[2]{\left(\frac{\partial^2 \text{CoS\_COR}(\lambda, Z, P, L)}{\partial Z \partial \lambda}\right)^2 + \left(\frac{\partial^2 \text{CoS\_TIS}(\lambda, Z, P, L)}{\partial Z \partial \lambda}\right)^2 + Prec^2(\lambda, Z, P, L)} \right)$$

As metric $M_2$ comprises the (second) derivatives of both CoS_COR and CoS_TIS, it expresses the stability of CoS during the overlay error measurement. Thus, by requiring that $$M_2(\lambda,Z,P,L)<\text{LIMIT}(M_2),$$

wherein LIMIT($M_2$) is a predefined limit for $M_2$, the measured overlay error will exhibit a high degree of stability and can thus support accurate calibration of the measured overlay error and robust overlay metrology.

For metric $M_2$, the same variables are used as for $M_1$: $AVG_N$ and $3\sigma_N$ are applied to N sites as for metric $M_1$. Similar considerations apply to metric $M_2$ as to $M_1$ depending on the construction of illumination assembly 16 with one or two illuminators.

Alternatively or additionally, other metrics may be generated using the data from landscapes 600, 602, 604, and 606 and from landscapes 700 and 702 to reflect different user-specific requirements.

Figure 10:
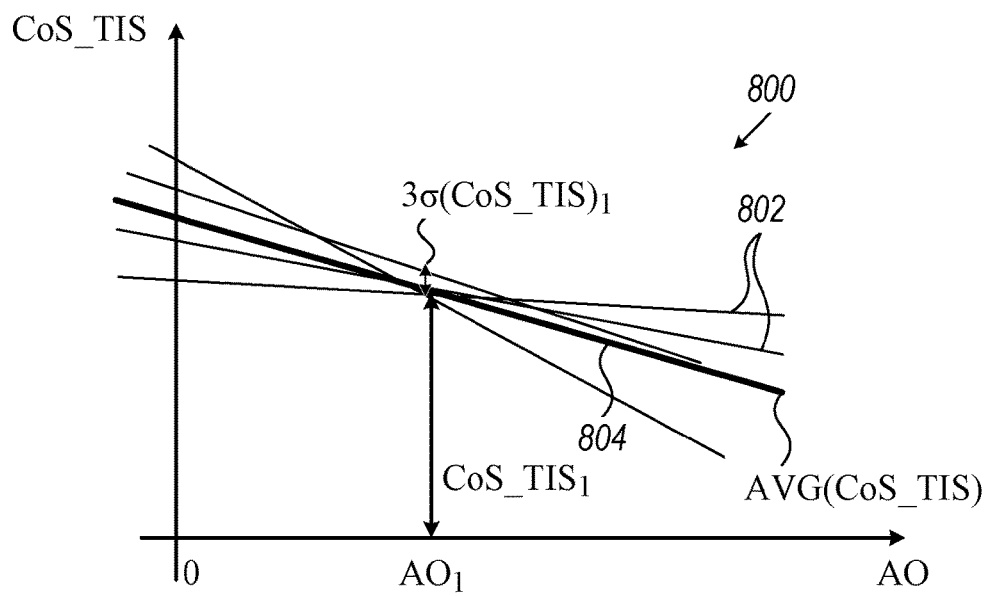
FIG. 10 is a plot that illustrates schematically the variation of CoS_TIS as a function of aperture offset, in accordance with an embodiment of the invention.

FIG. 10 is a plot 800 that illustrates schematically the variation of CoS_TIS as a function of aperture offset, in accordance with an embodiment of the invention.

Plot 800 shows the variation of CoS_TIS for four measurement sites (n=1, . . . , 4) as measured with apparatus 10 with respect to a lateral offset AO of one of the apertures of aperture assembly 36. The respective CoS_TIS values for the different sites are shown as lines 802. Due to variations across the four sites, such as layer contrast, feature topography, focus variations, site tilt, and process variations, lines 802 have varying offsets and slopes. The average of CoS_TIS over the four sites, AVG(CoS_TIS) as a function of AO is shown as a line 804.

The optimal (minimal) variation of CoS_TIS, $3\sigma$(CoS_TIS)$_1$, over the four measurement sites is found at an aperture offset $AO_1$, yielding CoS_TIS=CoS_TIS$_1$. The non-zero value of $AO_1$ indicates that there is a global angular alignment error between wafer 12 and imaging assembly 14.

Choosing a larger aperture offset than $AO_1$ will reduce AVG(CoS_TIS), but will increase $3\sigma$(CoS_TIS), indicating an opportunity for optimization between AVG(CoS_TIS) and $3\sigma$(CoS_TIS). Using independent light sources and aperture assemblies, as in apparatus 10 in FIG. 1, enables an independent optimization between AVG(CoS_TIS) and $3\sigma$(CoS_TIS) for each layer.

Figure 11A:
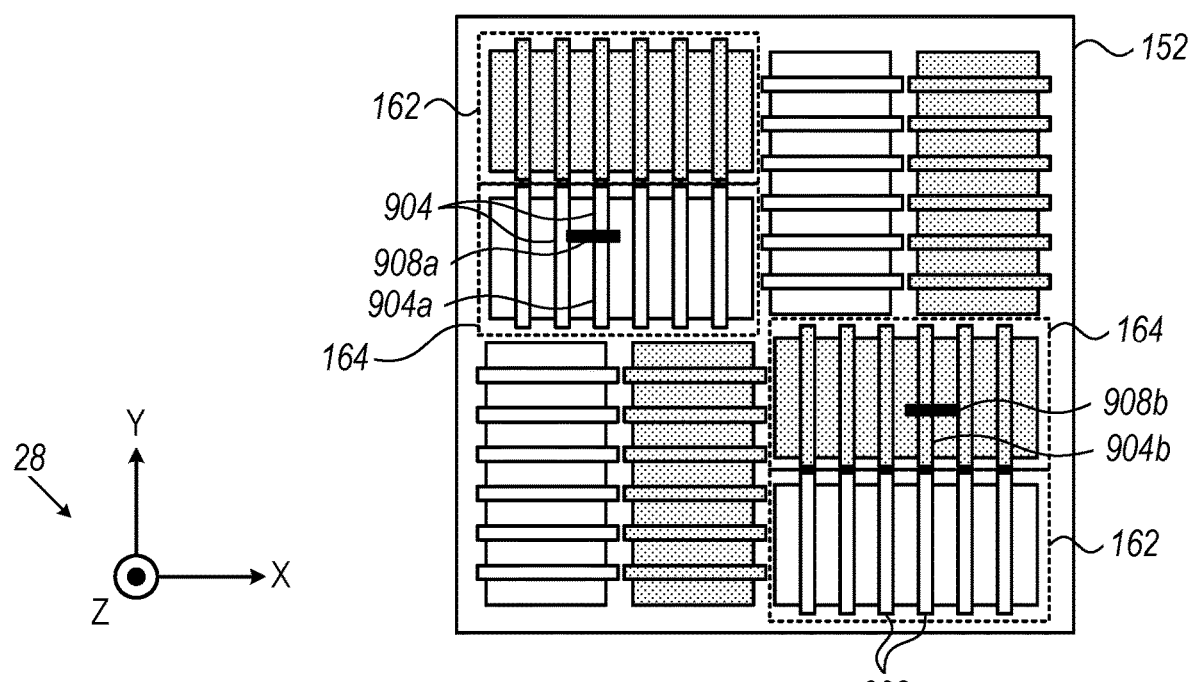
FIG. 11a is a schematic representation of an image of a proxy target that is acquired by a camera in an optical inspection apparatus, in accordance with an embodiment of the invention.
Figure 11B:
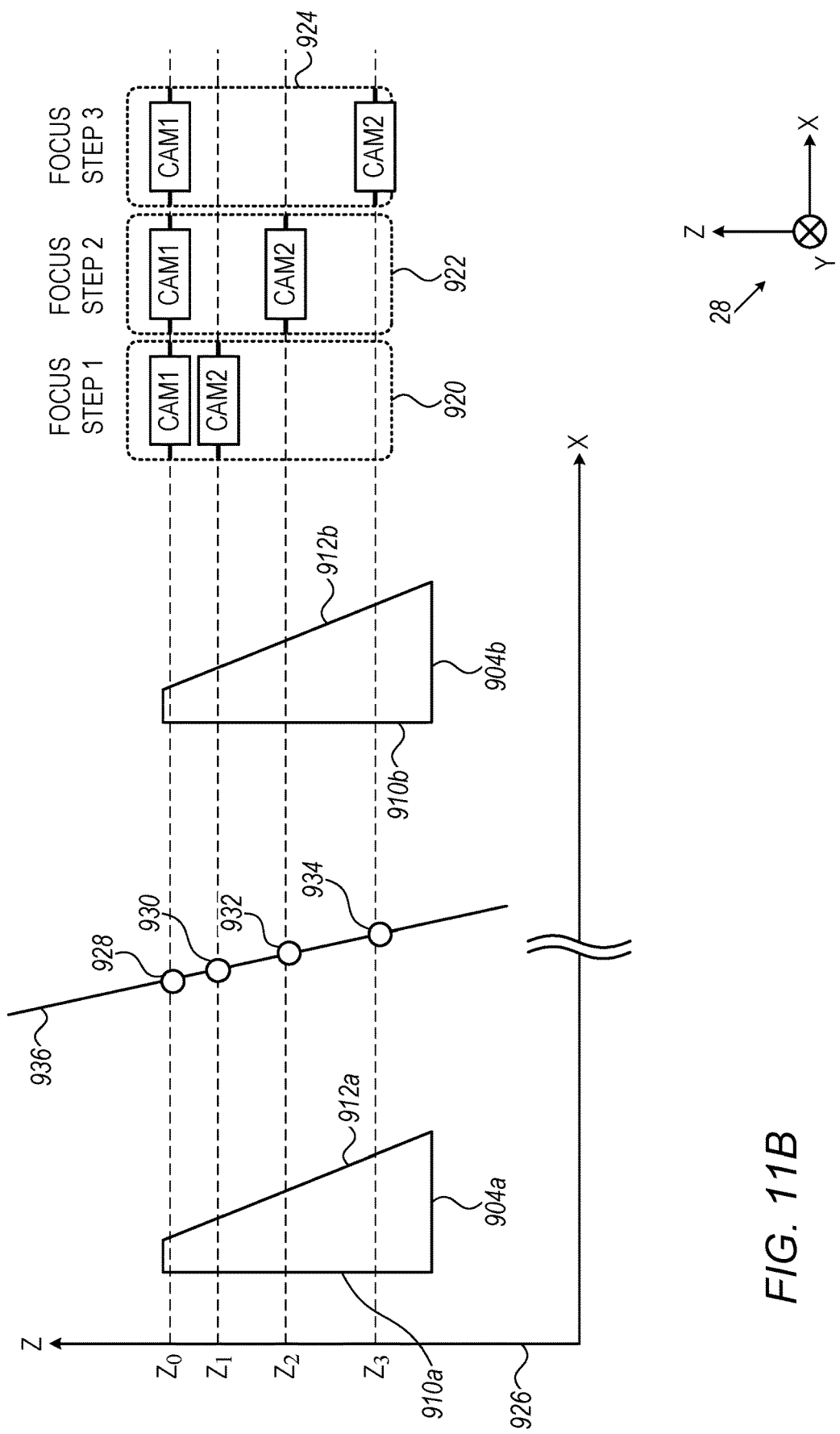
FIG. 11b is a schematic sectional view of grating bars in the proxy target of FIG. 9a, in accordance with an embodiment of the invention.

FIGS. 11a and 11b illustrate schematically the application of CoS as a function of focus for characterizing sidewall asymmetry of a target feature in AIM™ proxy target 152, in accordance with an embodiment of the invention.

FIG. 11a is an image of AIM™ proxy target 152 (shown in FIG. 3), with outlines marked around resist gratings 162 and process layer gratings 164 that are oriented along the x-axis. Respective grating bars 902 and 904 of gratings 162 and 164 are oriented along the y-axis.

FIG. 11b is a schematic sectional view of grating bars 904a and 904b, taken from process layer gratings 164 along lines 908a and 908b in FIG. 11a. In order to show the two sectional views together, the grating bars and their mutual separation along the x-axis are not shown in the same scale.

Due to asymmetrical process effects of the semiconductor fabrication process, such as, for example, an asymmetrical etch, grating bars 904 have an asymmetrical topographical structure, as shown in FIG. 11b: a left sidewall 910a of grating bar 904a is perpendicular to the xy-plane, whereas a right sidewall 912a meets the xy-plane at an oblique angle. Similarly, a left sidewall 910b of grating bar 904b is perpendicular to the xy-plane, whereas a right sidewall 912b of the grating bar meets the xy-plane at an oblique angle. Because proxy target 152 typically occupies a small area, with linear dimensions of a few tens of microns or less, all bars 904 in gratings 164 exhibit the same asymmetry as shown in FIG. 11b. The asymmetry of the grating bars shifts the CoS of gratings 164 with respect to focus, and thus the variation of CoS as a function of focus can be utilized to characterize the asymmetry, as is further detailed hereinbelow.

In order to characterize the asymmetry of grating bars 904a and 904b (and thereby the asymmetry of all grating bars 902 and 904), controller 24 reads out three images of gratings 164 acquired by cameras CAM1 and CAM2 in three focal steps 920, 922, and 924, at focal locations marked on a Z-axis 926. Controller 24 focuses cameras CAM1 and CAM2 on wafer 12, using contrast focus (FIG. 6), by movement in the z-direction of table 26 and/or by movement of the cameras by actuators 58 and 60. In all three focal steps 920, 922, and 924, CAM1 is focused at a fixed xy-plane location Z=$Z_0$ on gratings 162 and is registered to grating 162 at this fixed focus. Thus, this Z-coordinate $Z_0$ forms an "anchor focus" for the measurements.

In the three focal steps 920, 922, and 924, CAM2 is focused, respectively, at xy-planes with Z-coordinates $Z_1$, $Z_2$, and $Z_3$. During the image acquisitions, both cameras CAM1 and CAM2 are registered with projected gratings 154, 156, 158, and 160, as in first grating registration step 206 (FIG. 4), thus ensuring a known lateral registration between the cameras (registration in the xy-plane). From the images read out from CAM1, controller 24 computes the CoS of gratings 164, schematically marked as a point 928 in FIG. 11*b* and stores it in memory 25. From the three images read out from CAM2 in the three focal positions, controller 24 computes three respective CoS-values, schematically marked as points 930, 932, and 934, and stores them in memory 25. A curve 936, fitted by controller 24 to points 928, 930, 932, and 934, indicates the shift of CoS with respect to focus, and is thus a measure of the sectional asymmetry of grating bars 902 and 904. Curve 936 may be either a straight line or a higher-order curve.

The method described hereinabove may be similarly applied to process layer gratings 164 oriented in the y-direction, as well as to resist gratings 162 oriented both in the x- and y-directions, in order to characterize their sectional asymmetries. The actual overlay measurements made on production wafers can then be corrected to account for the apparent CoS shift that may occur as a result of these asymmetries.

In an alternative embodiment, CoS with respect to focus is measured using only one camera, for example CAM1. For a measurement of this kind, CAM1 is focused through the four focal positions $Z_0$, $Z_1$, $Z_2$, and $Z_3$, and images of gratings 164 are read out by controller 24 from CAM1 at each focal position and stored in memory 25. Controller 24 now computes respective CoS values from the images stored in memory 25, and computes CoS with respect to focus as described hereinabove for the two-camera measurement. The one-camera measurement method is more sensitive to the mechanical stability of apparatus 10 than the previously described two-camera method, as anchoring to a fixed feature and mutual camera registration cannot be implemented.

Although the methods described hereinabove are implemented using four focal positions (an "anchor" position $Z_0$ and three focal positions $Z_1$, $Z_2$, and $Z_3$), smaller or larger numbers of focal positions may alternatively be used.

Figure 12:
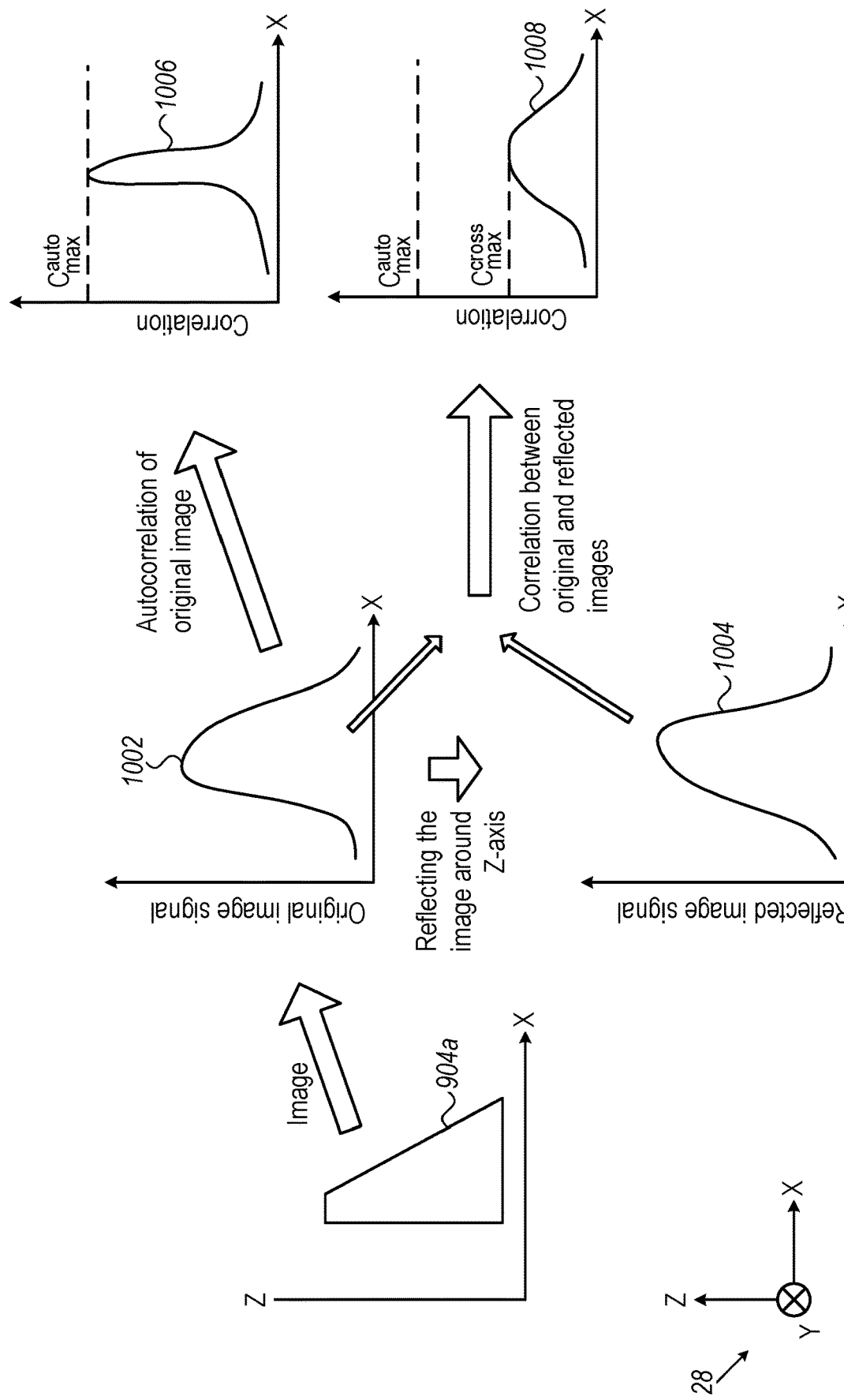
FIG. 12 is a sequence of plots illustrating schematically the use of correlations of image signals for monitoring the asymmetry of a feature in an overlay proxy target, in accordance with an embodiment of the invention.

FIG. 12 is a sequence of plots that illustrate schematically the use of correlations of image signals for monitoring the asymmetry of a target feature in an overlay proxy target, in accordance with an embodiment of the invention. As explained hereinabove, asymmetrical process effects of the semiconductor fabrication process, such as asymmetrical etch, may cause the target features of an overlay proxy target to have asymmetrical cross-sections. The present embodiment utilizes monitoring of these asymmetries (even without quantifying them) for monitoring the semiconductor fabrication process.

FIG. 12 shows a sectional view of grating bar 904*a* as in FIG. 11*b*. Controller 24 reads out an acquired image of bar 904*a* from, for example, CAM1, and converts the image into an image signal, stored in memory 25. A portion of the image signal along curve 608 (FIG. 8*a*) is shown as a curve 1002 in FIG. 12. From the image signal of curve 1002, controller 24 generates a reflected image signal by reflecting it around the z-axis, with the reflected image signal shown as a curve 1004.

Controller 24 computes two correlation curves 1006 and 1008: correlation curve 1006 is the autocorrelation of curve 1002 (correlation with itself), while correlation curve 1008 is the cross-correlation between curves 1002 and 1004. Curve 1006 has a maximum value of $C^{auto}_{max}$, whereas curve 1008 has a maximum value of $C^{cross}_{max}$. Due to the asymmetry of curve 1002, $C^{cross}_{max} < C^{auto}_{max}$. Comparison of the maximum value $C^{cross}_{max}$ of cross-correlation curve 1008 to the maximum value $C^{auto}_{max}$ of autocorrelation curve 1006 may be used as a measure of the asymmetry of image signal 1002, and thus of process effects causing an asymmetrical sectional profile of a target feature in the overlay proxy target.

The image of a target feature of an overlay proxy target, such as the image of bar 904*a*, may be acquired under varying operating conditions of apparatus 10, such as with varying wavelength and/or polarization of the illumination of wafer 12 and/or different focal settings. A variation of the ratio $C^{cross}_{max}/C^{auto}_{max}$ as a function of one or more of these operating conditions will produce a "correlation landscape," which may be further utilized for monitoring the semiconductor fabrication process while running the process. For example, if the ratio of the two correlation maxima $C^{cross}_{max}/C^{auto}_{max}$ falls below a pre-set limit, such as 0.8, it may be used to indicate unacceptable process variation.

The method described hereinabove may be similarly applied to process layer gratings 164 oriented in the y-direction, as well as to resist gratings 162 oriented both in the x- and y-directions, in order to characterize their sectional asymmetries.

The embodiments described hereinabove may be utilized separately or in combinations for determining an optimal overlay metrology recipe, which provides robust overlay measurement conditions in run-time for measurement of the overlay error. Such a recipe specifies optimal settings of focus, wavelength, polarization, illumination conditions, and objective lens pupil control. Different conditions may be applied respectively to process layer and resist layer.

Additionally or alternatively, information provided by the measurement techniques described above, for example regarding the variation of CoS with respect to focus, may be utilized by controller 24 in enhancing overlay metrology algorithms. The methods described hereinabove may further be generalized to additional illumination and collection channels for simultaneous measurement of overlay error between multiple pairs of layers.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

What is claimed is:

1. A method for metrology, comprising:
    directing at least one illumination beam to illuminate a semiconductor wafer on which at least first and second patterned layers have been deposited in succession, including a first target feature in the first patterned layer and a second target feature in the second patterned layer, overlaid on the first target feature;
    capturing a sequence of images of the first target feature and the second target feature while varying one or more imaging parameters over the sequence, wherein capturing the sequence of the images comprises capturing first and second images of the first target feature and the second target feature using first and second cameras in mutual registration, and wherein capturing the first and second images comprises projecting a registration image toward the first and second cameras, and registering the first and second cameras with respect to the registration image;
    processing the images in the sequence in order to identify respective centers of symmetry of the first target feature and the second target feature in the images and measure variations in the centers of symmetry as a function of the varying image parameters, wherein processing the images comprises measuring the variations in the centers of symmetry by comparing the first and second images; and applying the variations in measuring an overlay error between the first and second patterned layers.

2. The method according to claim 1, wherein the first patterned layer comprises a process layer and the second patterned layer comprises a resist layer deposited over the process layer.

3. The method according to claim 1, wherein projecting the registration image comprises generating and projecting a grating pattern onto respective detector arrays in the first and second cameras alongside the images of the first target feature and the second target feature.

4. The method according to claim 1, wherein capturing the first and second images comprises setting the one or more of the imaging parameters to a first setting in the first images and to a second setting in the second images.

5. The method according to claim 1, wherein setting the one or more of the imaging parameters comprises setting the first and second cameras in different, respective first and second focal positions, and stepping the first and second cameras through respective first and second sequences of the first and second focal positions in order to measure a variation of the centers of symmetry as a function of the first and second focal positions.

6. The method according to claim 5, wherein the first and second focal positions are separated by a constant focal distance $\Delta Z$, and in each step of the first and second sequences, both the first and second focal positions are incremented by $\Delta Z$.

7. The method according to claim 1, wherein the at least one illumination beam comprises first and second illumination beams in different, respective first and second polarization states, and wherein capturing the first and second images comprises applying a polarizing beamsplitter to direct light reflected from the semiconductor wafer in the first polarization state toward the first camera and to direct light reflected from the semiconductor wafer in the second polarization state toward the second camera.

8. The method according to claim 1, wherein capturing the sequence of the images comprises capturing the images of the first target feature and the second target feature at imaging parameters that are different, wherein processing the images comprises measuring the variations in the centers of symmetry as a function of the imaging parameters, and wherein the imaging parameters are focal settings, wavelengths, or polarization states.

9. The method according to claim 1, wherein capturing the sequence of the images comprises capturing the images of the first target feature and the second target feature at a plurality of different offsets of at least one aperture of the at least one illumination beam, and wherein processing the images comprises measuring the variations in the centers of symmetry as a function of the offsets of the aperture.

10. The method according to claim 1, wherein capturing the sequence of the images comprises capturing the images of the first target feature and the second target feature using a camera in different angular orientations of the semiconductor wafer relative to the camera, and wherein processing the images comprises measuring a tool-induced shift of the centers of symmetry as a function of the angular orientations.

11. The method according to claim 1, wherein applying the measured variations comprises finding, responsively to the measured variations, an optimal range of the one or more imaging parameters, and generating a recipe for measuring the overlay error by setting the one or more imaging parameters to values within the optimal range.

12. The method according to claim 11, wherein capturing the sequence of the images comprises capturing the images of multiple target features at a plurality of different locations on the semiconductor wafer, and wherein finding the optimal range comprises applying the variations measured at the different locations in order to choose the range that is optimal over an area of the semiconductor wafer.

13. The method according to claim 1, wherein processing the images comprises measuring an asymmetry of at least one of the target features.

14. A method for metrology, comprising:
directing at least one illumination beam to illuminate a semiconductor wafer on which at least one patterned layer has been deposited, including a grating that includes a plurality of bars oriented parallel to a predefined axis;

capturing one or more images of the grating, wherein capturing the one or more images comprises capturing first and second images of the grating using first and second cameras in mutual registration, and wherein capturing the first and second images comprises projecting a registration image toward the first and second cameras, and registering the first and second cameras with respect to the registration image;

processing the one or more images in order to characterize an asymmetry of one or more of the bars about the axis, wherein processing the one or more images comprises measuring the variations in the centers of symmetry by comparing the first and second images; and applying the characterized asymmetry in making a metrological evaluation of the patterned layer.

15. The method according to claim 14, wherein capturing the one or more images comprises capturing a sequence the images of the grating at different focal settings, and wherein processing the one or more images further comprises measuring the variations in a center of symmetry of the grating in the images as a function of the focal settings, and characterizing the asymmetry based on the measured variation.

16. The method according to claim 14, wherein processing the one or more images comprises computing a correlation between an image of the one or more of the bars and a reflected version of the image, and deriving a measure of the asymmetry from the correlation.

17. An optical inspection apparatus comprising:
an illumination assembly, configured to direct at least one illumination beam to illuminate a semiconductor wafer on which at least first and second patterned layers have been deposited in succession, including a first target feature in the first patterned layer and a second target feature in the second patterned layer, overlaid on the first target feature;

an imaging assembly configured to capture a sequence of images of the first target feature and the second target feature, wherein the imaging assembly comprises first and second cameras, which are in mutual registration and are configured to capture first and second images of the first target feature and the second target feature, and wherein the imaging assembly further comprises a projector, which is configured to project a registration image toward the first and second cameras; and a controller, configured to vary one or more imaging parameters of the apparatus over the sequence, to process the images in the sequence in order to identify respective centers of symmetry of the first target feature and the second target feature in the images and measure variations in the centers of symmetry as a function of the varying image parameters, and to apply the variations in measuring an overlay error between the first and second patterned layers, wherein the controller is configured to measure the variations in the centers of symmetry by comparing the first and second images and to register the first and second cameras with respect to the registration image.

18. The apparatus according to claim 17, wherein the projector is configured to generate and project a grating pattern onto respective detector arrays in the first and second cameras alongside the images of the first target feature and the second target feature.

19. The apparatus according to claim 17, wherein the controller is configured to set the one or more of the imaging parameters to a first setting in the first images and to a second setting in the second images.

20. The apparatus according to claim 17, wherein the controller is configured to set the first and second cameras in different, respective first and second focal positions, and to step the first and second cameras through respective first and second sequences of the first and second focal positions in order to measure a variation of the centers of symmetry as a function of the focal positions, and wherein the first and second focal positions are separated by a constant focal distance $\Delta Z$, and in each step of the first and second sequences, both the first and second focal positions are incremented by $\Delta Z$.

21. The apparatus according to claim 17, wherein the at least one illumination beam comprises first and second illumination beams in different, respective first and second polarization states, and wherein the imaging assembly comprises a polarizing beamsplitter, which is configured to direct light reflected from the semiconductor wafer in the first polarization state toward the first camera and to direct light reflected from the semiconductor wafer in the second polarization state toward the second camera.

22. The apparatus according to claim 17, wherein the imaging assembly is configured to capture the images of the first target feature and the second target feature at imaging parameters that are different, wherein the controller is configured to measure the variations in the centers of symmetry as a function of the imaging parameters, and wherein the imaging parameters are focal settings, wavelengths, or polarization states.

23. The apparatus according to claim 17, wherein the illumination assembly comprises at least one aperture of the at least one illumination beam, and wherein the imaging assembly is configured to capture the images of the first target feature and the second target feature at multiple different offsets of the at least one aperture, and wherein the controller is configured to measure the variations in the centers of symmetry as a function of the offsets of the aperture.

24. The apparatus according to claim 17, wherein the imaging assembly is configured to capture the images of the first target feature and the second target feature in different angular orientations of the semiconductor wafer relative to the imaging assembly, and wherein the controller is configured to measure a tool-induced shift of the centers of symmetry as a function of the angular orientations.

25. The apparatus according to claim 17, wherein the controller is configured to find, responsively to the measured variations, an optimal range of the one or more imaging parameters, and to generate a recipe for measuring the overlay error by setting the one or more imaging parameters to values within the optimal range.

26. The apparatus according to claim 25, wherein the imaging assembly is configured to capture the images of multiple target features at multiple different locations on the semiconductor wafer, and wherein the controller is configured to find the optimal range by applying the variations measured at the multiple different locations in order to choose the range that is optimal over an area of the semiconductor wafer.

27. The apparatus according to claim 17, wherein the controller is configured to measure an asymmetry of at least one of the first target feature and the second target feature.

28. An optical inspection apparatus, comprising:
an illumination assembly configured to direct at least one illumination beam to illuminate a semiconductor wafer on which at least one patterned layer has been deposited, including a grating that includes a plurality of bars oriented parallel to a predefined axis;
an imaging assembly configured to capture one or more images of the grating, wherein the imaging assembly comprises first and second cameras, which are in mutual registration and are configured to capture first and second images of the grating, and wherein the imaging assembly further comprises a projector, which is configured to project a registration image toward the first and second cameras; and
a controller configured to process the one or more images in order to characterize an asymmetry of one or more of the bars about the axis and to apply the characterized asymmetry in making a metrological evaluation of the patterned layer, wherein the controller is configured to measure the variations in the centers of symmetry by comparing the first and second images and to register the first and second cameras with respect to the registration image.

29. The apparatus according to claim 28, wherein the imaging assembly is configured to capture a sequence of the images of the grating at different focal settings, and wherein the controller is further configured to measure the variations in the centers of symmetry of the grating in the images as a function of the focal settings, and to characterize the asymmetry based on the measured variation.

30. The apparatus according to claim 28, wherein the controller is configured to compute a correlation between an image of the one or more of the bars and a reflected version of the image, and to derive a measure of the asymmetry from the correlation.

* * * * *